United States Patent
Spijker

(10) Patent No.: US 10,666,269 B2
(45) Date of Patent: *May 26, 2020

(54) HITLESS RE-ARRANGEMENTS IN COUPLED DIGITAL PHASE-LOCKED LOOPS

(71) Applicant: Integrated Device Technology, Inc., San Jose, CA (US)

(72) Inventor: Menno Spijker, Ottawa (CA)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/451,433

(22) Filed: Jun. 25, 2019

(65) Prior Publication Data

US 2019/0312580 A1    Oct. 10, 2019

Related U.S. Application Data

(63) Continuation of application No. 15/833,117, filed on Dec. 6, 2017, now Pat. No. 10,355,699.

(Continued)

(51) Int. Cl.
   *H03B 5/04* (2006.01)
   *H03L 7/07* (2006.01)
   (Continued)

(52) U.S. Cl.
   CPC ............... *H03L 7/08* (2013.01); *H03B 5/04* (2013.01); *H03B 5/32* (2013.01); *H03L 7/07* (2013.01);
   (Continued)

(58) Field of Classification Search
   CPC . H03L 7/08; H03L 7/07; H03L 7/0802; H03L 7/0805; H03L 7/0807; H03L 7/081;
   (Continued)

(56) References Cited

U.S. PATENT DOCUMENTS 5,546,433 A      8/1996  Tran et al. .................... 375/376
5,905,388 A  *   5/1999  Van Der Valk .......... H03C 1/50
                                                         327/107

(Continued)

OTHER PUBLICATIONS

Ransom Stephens,"The Future of Multi-Clock Systems", 2007, http://www.magazines007.com/pdf/DC08-R_Stephens.pdf, DesignCon2008, pp. 1-14.

(Continued)

*Primary Examiner* — Patrick C Chen
(74) *Attorney, Agent, or Firm* — Christopher P. Maiorana, PC

(57) ABSTRACT

An apparatus comprising an accumulator circuit and an offset register. The accumulator circuit may be configured to (a) receive a plurality of frequency offset values from a plurality of sourcing DPLLs and (b) generate a current combined offset value in response to a sum of the frequency offset values. The offset register may be configured to (a) store an offset value corresponding to the current combined offset value in a first mode and (b) store an offset value corresponding to an updated offset value in a second mode. The updated offset value may comprise a difference between the offset value stored in the offset register and the current combined offset value. The offset value may be presented to a receiving DPLL during a re-arrangement of the sourcing DPLLs. Presenting the offset value may reduce a phase transient caused by the re-arrangement.

20 Claims, 11 Drawing Sheets

Related U.S. Application Data

(60) Provisional application No. 62/431,191, filed on Dec. 7, 2016.

(51) Int. Cl.
*H03L 7/099* (2006.01)
*H04W 88/08* (2009.01)
*H03L 7/08* (2006.01)
*H03L 7/093* (2006.01)
*H03B 5/32* (2006.01)

(52) U.S. Cl.
CPC ............ *H03L 7/093* (2013.01); *H03L 7/0991* (2013.01); *H04W 88/08* (2013.01)

(58) Field of Classification Search
CPC ... H03L 7/0812; H03L 7/0814; H03L 7/0816; H03L 7/0818; H03L 7/083–0898; H03L 7/091–7/0998; H03L 7/10–1077; H03L 7/113; H03L 7/12; H03L 7/14–148; H03B 5/04; H03B 5/32–38; H04W 88/08–10
See application file for complete search history.

(56) References Cited

U.S. PATENT DOCUMENTS

| | | | |
|---|---|---|---|
| 6,570,454 B2* | 5/2003 | Skierszkan | H03L 7/07 327/147 |
| 9,231,752 B1 | 1/2016 | Yan et al. | |
| 9,236,873 B1 | 1/2016 | Buell | |
| 2002/0070811 A1 | 6/2002 | Skierszkan | 331/1 A |
| 2003/0094982 A1* | 5/2003 | Zampetti | H03L 7/07 327/159 |
| 2007/0024383 A1* | 2/2007 | Spijker | H03L 7/107 331/34 |
| 2012/0025881 A1* | 2/2012 | Ding | H03L 7/22 327/157 |

OTHER PUBLICATIONS

Symmetricom, "Synchronizing 2G/3GBase Stations as Backhaul Networks Transition to Ethernet", https://www.microsemi.com/document-portal/doc_view/133252-synclu-onizing-2g-3g-base-stations-as-backhaul-networks-transition-to-ethernet, 2012, Symmetricom, pp. 1-3.

* cited by examiner

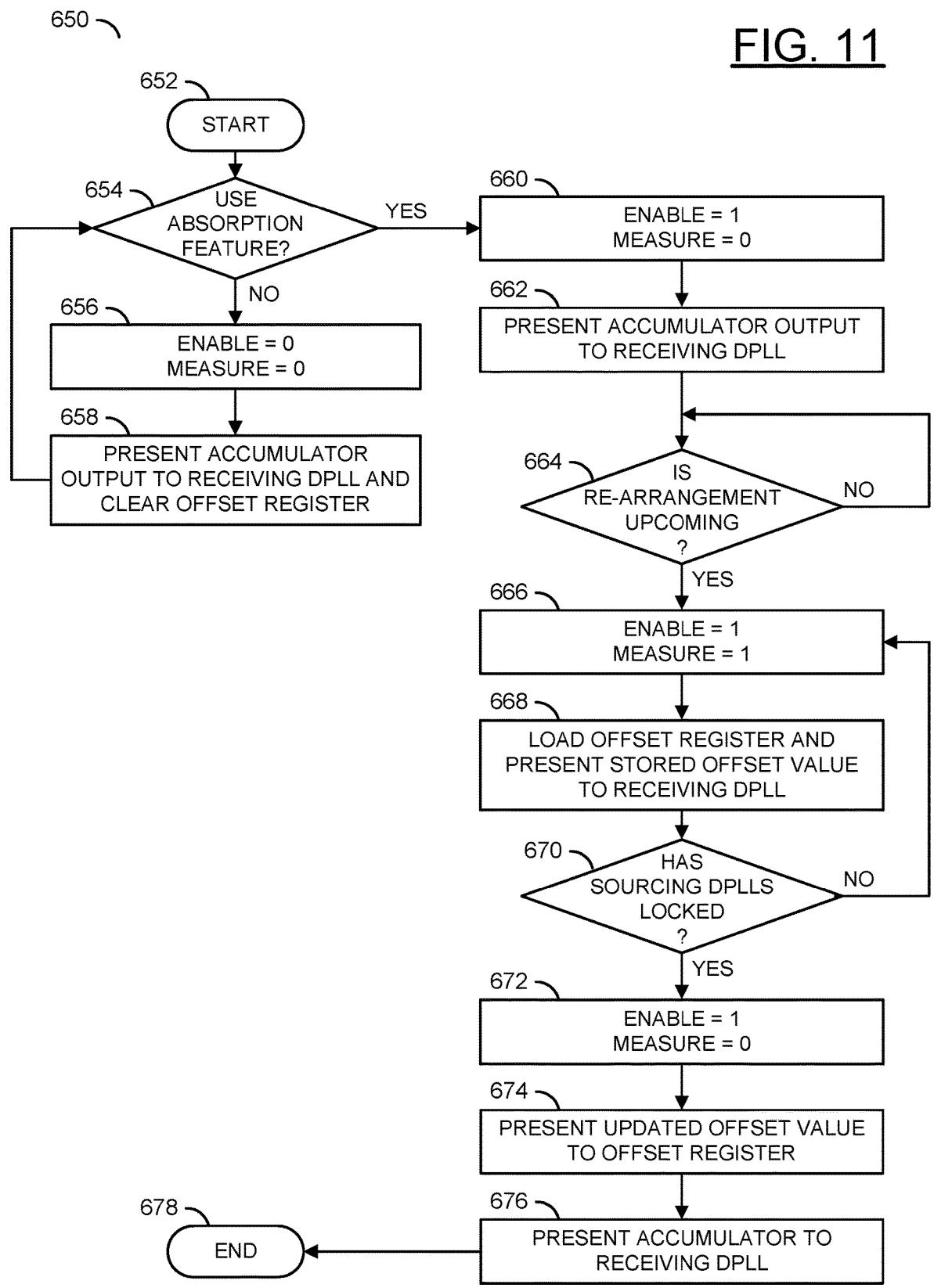

HITLESS RE-ARRANGEMENTS IN COUPLED DIGITAL PHASE-LOCKED LOOPS

This application relates to U.S. Ser. No. 15/833,117, filed Dec. 6, 2017, which relates to U.S. Provisional Application No. 62/431,191, filed Dec. 7, 2016, which are each hereby incorporated by reference in their entirety.

FIELD OF THE INVENTION

The invention relates to integrated circuits generally and, more particularly, to a method and/or apparatus for implementing hitless re-arrangements in coupled digital phase-locked loops (DPLLs).

BACKGROUND

In a system of multiple coupled digital phase-locked loops (DPLLs), a receiving DPLL can add to a frequency offset from a loop filter within the receiving DPLL using a frequency offset received from one or multiple sourcing DPLLs. If one of the sourcing DPLLs switches to another input reference clock with a different fractional frequency offset (ffo), or the receiving DPLL switches from one sourcing DPLL to another sourcing DPLL, the added frequency offset could incur a rapid change. The rapid change could cause a large phase transient on the output of the receiving DPLL. A mechanism is needed to prevent re-arrangements in the sourcing of the DPLL coupling or input reference switches from causing a phase transient on the output of the receiving DPLL.

It would be desirable to implement hitless re-arrangements in coupled DPLLs.

SUMMARY

The invention concerns an apparatus comprising an accumulator circuit and an offset register. The accumulator circuit may be configured to (a) receive a plurality of frequency offset values from a plurality of sourcing digital phase-locked loop circuits and (b) generate a current combined offset value in response to a sum of the frequency offset values. The offset register may be configured to (a) store an offset value corresponding to the current combined offset value in a first mode and (b) store an offset value corresponding to an updated offset value in a second mode. The updated offset value may comprise a difference between the offset value stored in the offset register and the current combined offset value. The offset value may be presented to a receiving digital phase-locked loop circuit during a re-arrangement of the sourcing digital phase-locked loop circuits. Presenting the offset value may reduce a phase transient caused by the re-arrangement.

BRIEF DESCRIPTION OF THE FIGURES

Embodiments of the invention will be apparent from the following detailed description and the appended claims and drawings in which:

FIG. 11 is a flow diagram illustrating a method for adjusting control logic in response to a re-arrangement.

DETAILED DESCRIPTION OF THE EMBODIMENTS

Embodiments of the present invention include providing hitless re-arrangements in coupled DPLLs that may (i) provide a simple mechanism to absorb changes in total frequency offset of DPLLs due to re-arrangements of sourcing DPLLs or reference switches in the sourcing DPLLs, (ii) utilize a-priori information about re-arrangement to inter DPLL coupling and/or reference switches, (iii) be controlled with only two signals, (iv) use an offset register to absorb transients of the overall combined offset from all sourcing DPLLs, (v) switch to using a value from an offset register instead of the accumulator when a re-arrangement is upcoming, (vi) update the offset register based on the accumulator and a stored value when the re-arrangement of done, and/or (vii) be implemented as one or more integrated circuits.

Figure 1:
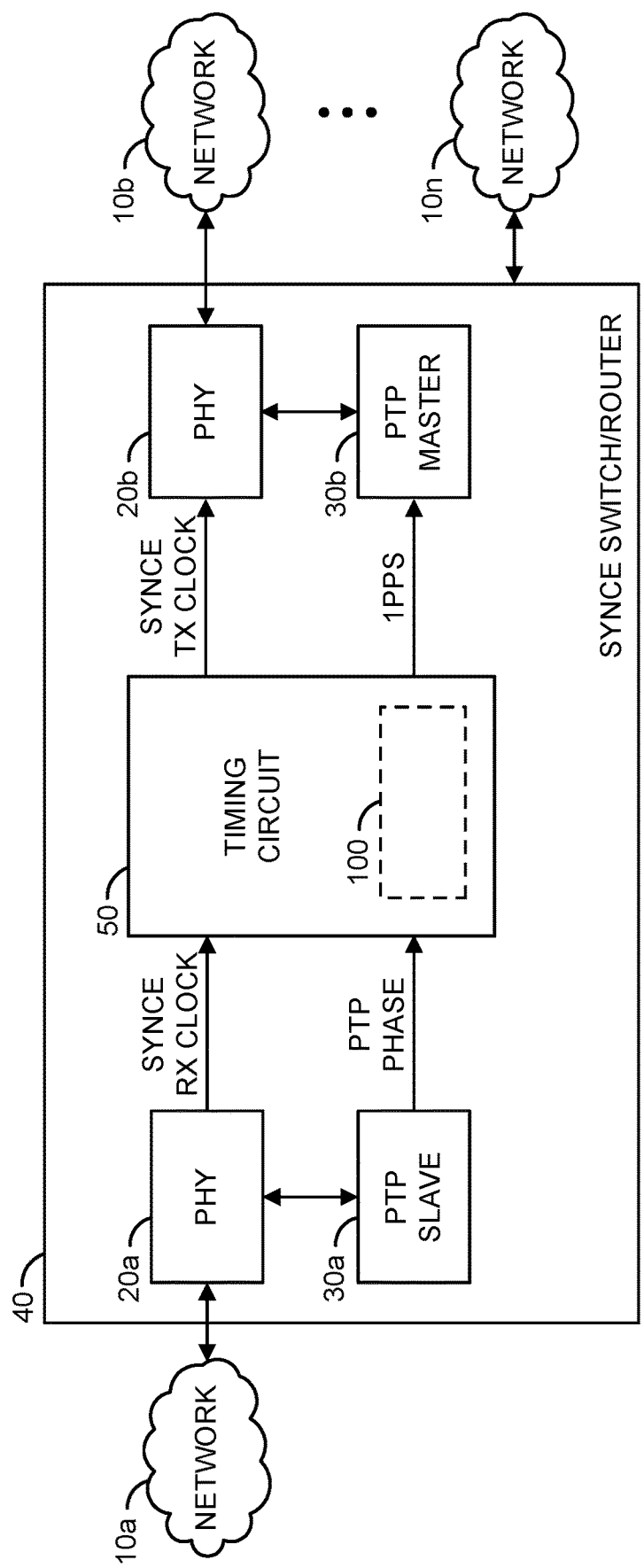
FIG. 1 is a diagram illustrating a context of an example embodiment of the present invention.

Referring to FIG. 1, a context of an example network embodiment of the present invention is shown. In one example, the present invention may be implemented as a portion of a telecommunications network circuit. For example, the network circuit may be implemented as one or more components of a Synchronous Ethernet (e.g., SyncE) switch and/or a router box. Generally, the invention may be implemented to synchronize multiple networks (e.g., two or more). The number of networks may be varied according to the design criteria of a particular implementation.

The example embodiment may comprise blocks (or circuits) 10a-10n, blocks (or circuits) 20a-20b, blocks (or circuits) 30a-30b a block (or circuit) 40 and/or a block (or circuit) 50. The blocks 10a-10b may implement network segments. The blocks 20a-20b may implement a PHY transceiver (e.g., an Ethernet physical layer transceiver chip). The blocks 30a-30b may implement a PTP module (e.g., a precision timing protocol circuit). The block 40 may implement a switch and/or router. In an example, the circuit 40 may implement a SyncE switch and/or router. The block 50 may implement a network card and/or a network circuit board. For example, the block 50 may implement a timing circuit. In the example shown, the network segment 10a may be coupled to the block 20a and the network segment 10b may be coupled to the block 20b. The block 20a may be coupled to the block 30a and the block 50. The block 20b may be coupled to a block 30b and the block 50. The embodiment may comprise other components (not shown).

The number, type and/or arrangement of the components 10a-50 may be varied according to the design criteria of a particular implementation.

Generally, the PHY transceivers 20a-20b, the PTP modules 30a-30b, and/or the network board 50 may be deployed throughout a telecommunications network. In one example, the PHY transceivers 20a-20b, the PTP modules 30a-30b and/or the network board 50 may be deployed in a road-side cabinet and/or a server rack. In an implementation of a SyncE switch and/or router box 40, multiple network segments 10a-10n may be coupled. In an example, the circuit 40 may be implemented as a single integrated circuit or as a number of integrated circuits on a printed circuit board (e.g., a network card, server blade, etc.).

The network segments 10a-10n may implement a number of local area networks (LANs) having operations that may be synchronized with one another. In various embodiments, the network segments 10a-10n may comprise networks based on time division multiplexing (TDM), such as SONET/SDH/PDH, and/or Ethernet-based packet networks. The network segments 10a-10n may be configured to facilitate delivery of a variety of communication services. The blocks 20a-20n may be implemented as Ethernet PHY transceiver chips (e.g., available from Marvell or Broadcom). In an example, the blocks 30a-30b may implement an IEEE 1588 compliant packet based timing scheme. The PTP slave clock 30a generally receives sync messages from the PTP master clock 30b. The time base is determined for the PTP slave clock by a PTP master clock higher in hierarchy. The PTP master clock generally initiates sync messages to PTP slave clocks and determines the time base for PTP slave clocks lower in hierarchy.

Many existing telecommunication networks are based on TDM. TDM networks need precise frequency synchronization for accurate data transfer. TDM networks work well for voice and low bandwidth data. However, some modern communication services need both time and frequency synchronization. There are many timing applications that make use of highly accurate synchronized distributed clocks (e.g., data acquisition, digital video distribution, financial trading, the Internet of Things (IoT), small cell coordination, manufacturing automation and robotics, power systems, and mobile telephone cell coordination). Wireless backhaul is an example application driving the need, where mobile subscribers must be handed off from one service area or cell to another. Typical computer networks closer to the end user are Ethernet-based packet networks. These are low cost asynchronous networks that transfer data with much less frequency accuracy than the TDM networks.

Approaches used to "synchronize" packet networks to TDM networks generally include: Primary Reference Source (PRS), Synchronous Ethernet (SyncE), and Precision Time Protocol (PTP). The PRS approach utilizes a primary reference clock (PRC) yielding Stratum 1 quality frequency and timing, such as a GPS-derived clock, at every node communicating to a TDM network. The PRS approach provides a high quality but relatively costly approach. Synchronous Ethernet (SyncE) is an International Telecommunication Union ITU-T standard for computer networking that facilitates the transfer of clock signals over the Ethernet physical layer. SyncE differs from "regular" Ethernet with respect to the carrier clock. In SyncE, the carrier clock is synchronized and traceable to a primary reference clock (PRC), whereas with regular Ethernet the carrier clock is a locally generated free running clock. In both cases, the carrier clock is extracted from data received by the physical layer (PHY). In the SyncE approach, free-running crystal oscillators at each Ethernet node, having frequencies within ±100 ppm of each other, are replaced by clock recovery phase-locked loops (PLLs) with free-run accuracy of ±4.6 ppm. For a PLL device that needs to lock to a physical SyncE clock, the process is essentially the same as locking to any other telecom-type clock with the frequency being a function of application.

The packet based timing approach inserts dedicated timing stamp packets into a data stream of the packet network. IEEE 1588 is a standard that defines the distribution of timing over packet based networks. As will be understood by those skilled in the art, the timing is no longer carried by a physical clock. Instead, time stamps are sent back and forth between a server (e.g., master) and a client (e.g., slave). The time stamps from the server are linked to the PRC (Cesium, Rubidium, GPS, etc.), whereas the time stamps of the client are linked to the clock recovered by the client (e.g., from packet data). In particular, the client extracts the timing from a collection of received and locally generated time stamps. A digitally-controlled oscillator (DCO) at the client generates the physical clock and a 1 pulse per second (1PPS) timing pulse. Ideally, the 1PPS timing pulse generated by the client is phase aligned with the 1PPS signal generated by the server. The client needs to control both the frequency of the output clock(s) and frame/timing pulses as well as the phase of the 1PPS timing pulse. The latter is preferably independent of the output clock frequency notwithstanding the fact that the frequency and phase are hard related to each other. The independence is due to the fact that the phase/position of the 1PPS timing pulse during the initial snap alignment may be adjusted without changing the frequency and phase of the output clocks.

Using a combination of both SyncE and IEEE 1588 for synchronization typically provides the stability and precision of a physical SyncE clock with the ability to synchronize frame/timing pulses in accordance with IEEE 1588. The SyncE clock and the IEEE 1588 time stamps may or may not be traceable to the same primary reference clock. But, if the SyncE clock and the IEEE 1588 time stamps are traceable to the same primary reference clock, then the SyncE clock can be used for: (i) frequency synchronization of the output clock and the frame/timing pulse; and (ii) phase alignment of the output clock to the input SyncE clock. Traceable time stamps may be achieved by the standard function of the PLL, which is the same as in a regular telecom clock (E1, T1, SONET, etc.) application. In addition, the IEEE 1588 time stamps may be used to calculate the phase offset between the 1PPS timing pulse of the server and the 1PPS timing pulse of the client and then align the two pulses by moving the 1PPS timing pulse of the client (in phase). The client typically should be able to move the 1PPS timing pulse by ±0.5 sec.

PTP based on the IEEE 1588 standard has been widely adopted as the method for implementing packet based timing. The IEEE 1588 based PTP is a lower cost solution that can support both frequency and phase synchronization traceable to a primary reference source. Synchronization is implemented by messages exchanged between a master clock and a slave clock on the network. Both SyncE and packet based (IEEE 1588) synchronization approaches are recognized and specified by the ITU-T G.8261 standard. The SyncE approach only supplies accurate frequency. The SyncE approach does not supply accurate phase information, since the path delays between network elements are generally unknown. Using a combination of both SyncE and IEEE 1588 for synchronization typically provides the stability and precision of a physical SyncE clock with the ability to synchronize frame/timing pulses in accordance with IEEE 1588.

In the example shown, the network segment 10a may be a transmitting (e.g., sending) network and the network segment 10b may be a receiving network. The PHY transceivers 20a-20b may be configured to send/receive data to/from the network segment 10a-10b, the PTP modules 30a-30b and/or the network board 50. In the example shown, the PHY transceivers 20a-20b may generate and/or receive a signal (e.g., SYNCE RX CLOCK or SYNCE TX CLOCK, respectively). The signal SYNCE RX CLOCK from the block 20a to the block 50 may communicate a physical SyncE clock recovered from the network segment 10a. The signal SYNCE TX CLOCK from the block 50 to the block 20b may communicate a SyncE transmit clock for broadcast to one or more of the network segments 10b-10n.

The PTP modules 30a-30b may be configured to provide precise time over an Internet computing network. For example, the PTP modules 30a-30b may be interconnected by switches (e.g., dedicated, high-speed LAN segments interconnected by switches) and/or synchronize device clocks over the computing network. In the example shown, the PTP module 30a may implement a PTP slave module. The PTP slave module 30a may present a signal (e.g., PTP PHASE). The signal PTP PHASE may be received by the network board 50. In the example shown, the PTP module 30b may implement a PTP master module. The PTP master module 30b may receive a signal (e.g., 1PPS). The signal 1PPS may be generated by the network board 50. Generally, the signals SYNCE RX CLOCK, SYNCE TX CLOCK, the signal PTP PHASE and/or the signal 1PPS may be used to synchronize the networks 10a-10b (e.g., a wide area network).

The network board 50 may be configured to synchronize a timing of communication signals transmitted and/or received using one or more communication protocols. In some embodiments, the network board 50 may be implemented as a component of the SyncE router and/or switch 40. In one example, the network board 50 may be used to implement a synchronous Ethernet Wide Area Network (WAN). In some embodiments, the network board 50 may be implemented to facilitate synchronous communication in a digital subscriber line access multiplexer (DSLAM).

In the example shown, the network board may comprise a block (or circuit or apparatus) 100. The apparatus 100 may implement an absorption circuit. The absorption circuit 100 may be configured to perform phase absorption in response to phase and/or time changes on selected input clocks. Details of the absorption circuit 100 may be described in association with FIG. 7.

The blocks 20a-20b, the blocks 30a-30b, and the block 50 generally illustrate a conceptual timing portion of the SyncE switch or router 40. Data paths including the PHYs 20a-20n with the actual switching and/or routing data circuits in between are not shown. Typically, an Ethernet switch or router gets more than two network nodes. One of the network nodes (e.g., network segment 10a) is generally chosen as the timing source and the rest of the network nodes (e.g., network segments 10b-10n) are synchronized to the source. Thus, only network segments 10a and 10b are shown to illustrate the timing concept. Although the other network segments are not shown for clarity, it would be apparent to those skilled in the field of the invention that the PTP master 30b may be configured to drive multiple channels of a respective PHY to multiple network nodes.

Figure 2:
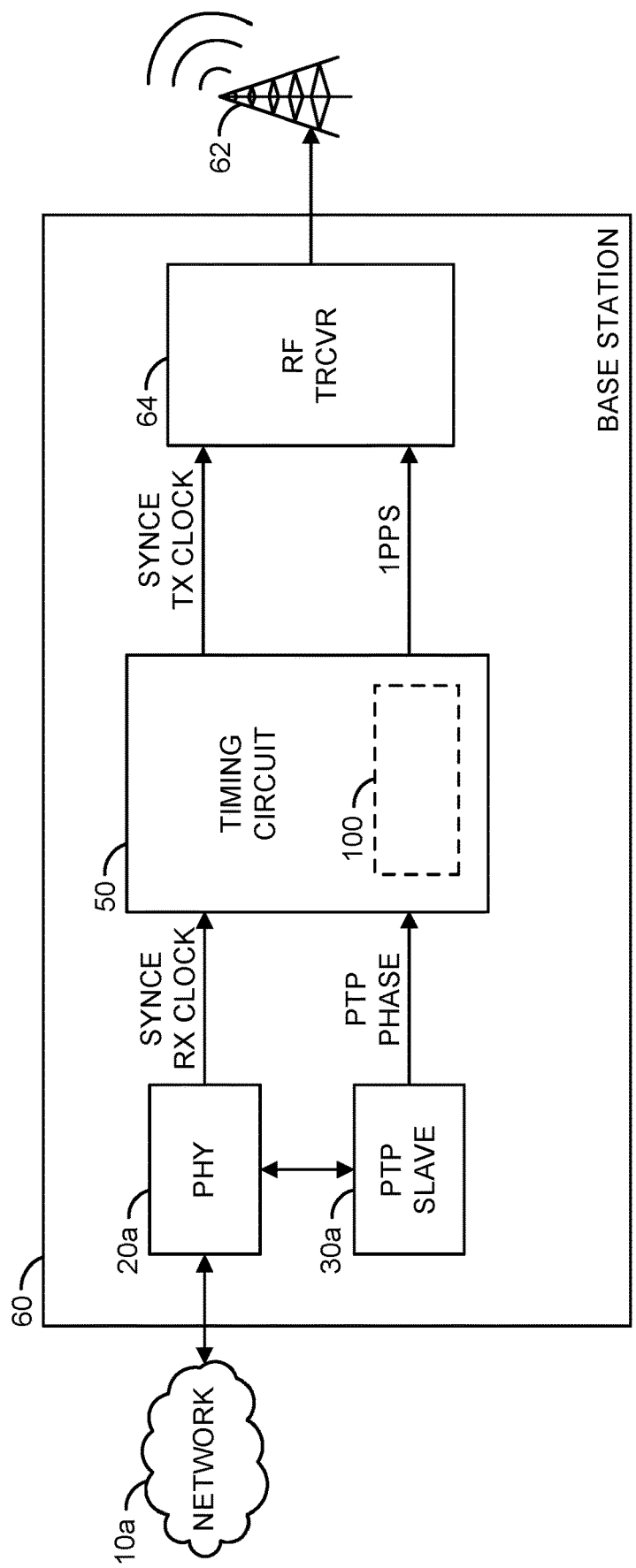
FIG. 2 is a diagram illustrating a mobile communication embodiment example of the present invention.

Referring to FIG. 2, a mobile communication embodiment example of the present invention is shown. The mobile communication embodiment may comprise the network segment 10a, the PHY transceiver 20a, the PTP slave module 30a, the network board 50, a block (or circuit) 60, a block (or circuit) 62 and/or a block (or circuit) 64. The circuit 60 may implement a base station. In some embodiments, the network board 50 may be implemented within the base station 60 coupled with the network segment 10a. The circuit 62 may implement a communication device (e.g., a transceiver and antenna array). The circuit 64 may implement a radio frequency (RF) transceiver 64. The RF transceiver 64 may be configured to receive the signals SYNCE TX CLOCK and 1PPS from the circuit 50.

The base station 60 may implement a mobile communication base station (e.g., LTE eNodeB, small cell base station, etc.). In some embodiments, the PHY transceiver 20a, the PTP module 30a and/or the network board 50 may be implemented in a mobile network base station application. For example, the network board 50 may be configured to provide node clocks for cellular and/or wireless local loop (WLL) base-stations (e.g., for GSM, 3G, 4G, LTE and/or 5G communication). The synchronous communication applications and/or protocols implemented by the network card 50 may be varied according to the design criteria of a particular implementation.

Figure 3:
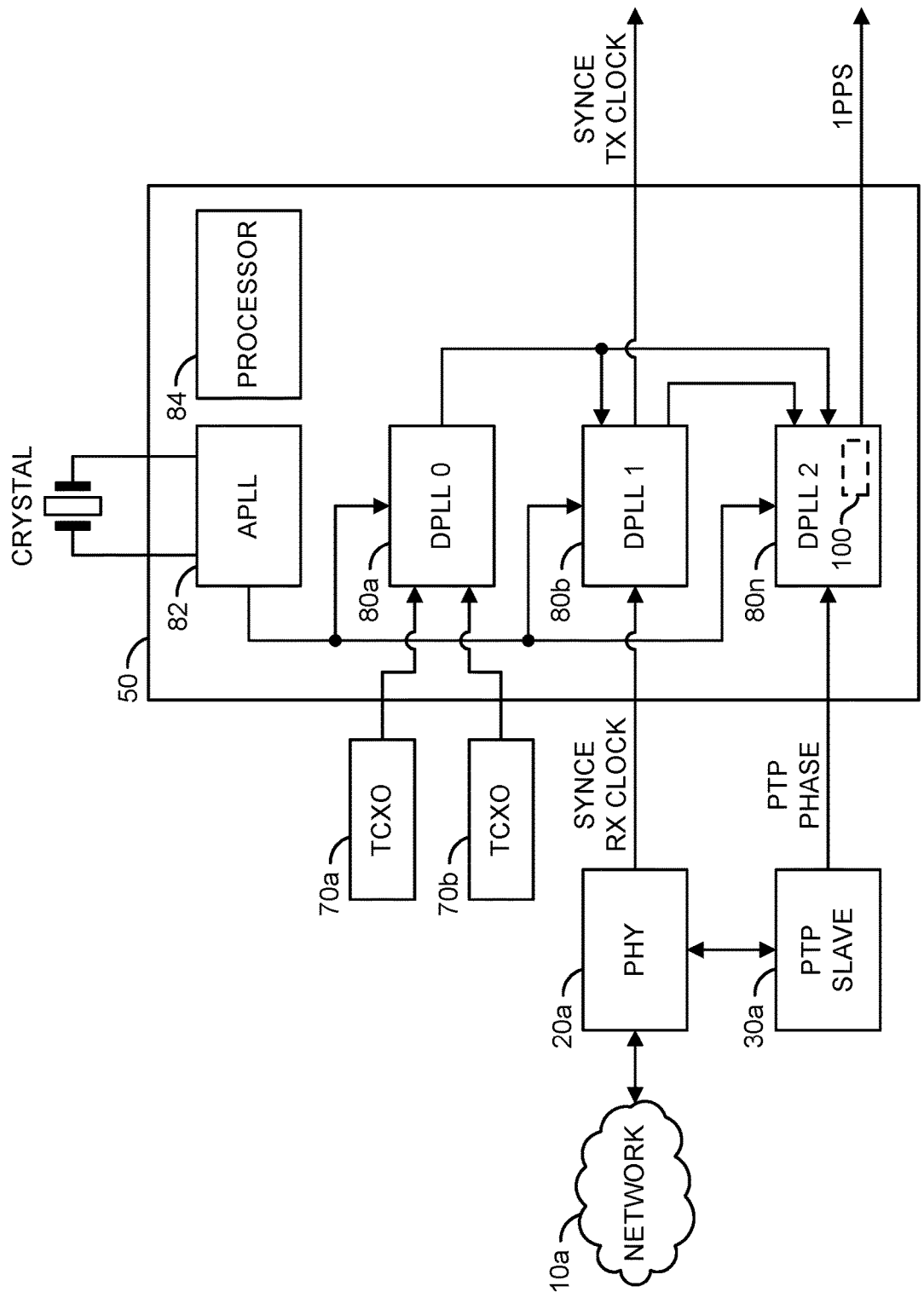
FIG. 3 is a diagram illustrating components of a network board context of the present invention.

Referring to FIG. 3, components of a network board context of the present invention are shown. The example embodiment may comprise the network 10a, the PHY transceiver 20a, the PTP slave module 30a, the network board 50 and/or blocks (or circuits) 70a-70b. The blocks 70a-70b may implement temperature compensated crystal oscillator (TXCO) circuits and/or oven compensated crystal oscillator (OCXO) circuits. In one example, the network board 50 may be implemented in the context of a timing application of a telecom boundary clock as described in Recommendation ITU-T G.8273.2 Appendix III, appropriate portions of which are incorporated by reference. The network board 50 may receive the timing signals SYNCE RX CLOCK, PTP PHASE and/or output from the TXCO circuits 70a-70b (e.g., reference clock signals). The network board 50 may output the signals SYNCE TX CLOCK and/or 1PPS. The signals SYNCE RX CLOCK, PTP PHASE, SYNCE TX CLOCK and/or 1PPS may be implemented as described in association with FIG. 1. The example embodiment may comprise other components (not shown). The number, type and/or arrangement of the components 10a-70 may be varied according to the design criteria of a particular implementation.

The TCXO circuits 70a-70b may provide a redundant TCXO system. For example, the network board 50 may implement a multiplexer to select between the TCXO circuits 70a-70b (e.g., for use as a reference clock). The redundant TCXO system may be used to select one of the TCXO circuits 70a-70b as a backup in the case that one of the TCXO circuits 70a-70b fails. The TCXO circuits 70a-70b may provide a precision frequency source with a high level of temperature stability.

The network board 50 may comprise blocks (or circuits) 80a-80n, a block (or circuit) 82 and/or a block (or circuit) 84. The circuits 80a-80n may implement digital phase-locked loops (DPLLs). The circuit 82 may implement an analog phase-locked loop (APLL). For example, APLL 82 may implement a local crystal oscillator based system clock. Generally, crystal oscillators provide very good short term stability (e.g., low jitter) but are quite sensitive to temperature variations (e.g., wander). The system clock 82 may provide a common clock signal to all of the DPLLs 80a-80n and/or may be seen as a noise source within the DPLL loop. The circuit 84 may implement a processor. The network board 50 may comprise other components (not shown). The number, type and/or arrangement of the components of the network board 50 may be varied according to the design criteria of a particular implementation.

The DPLLs 80a-80n may be configured to generate an output signal (e.g., the signal SYNCE TX CLOCK to the PHY transceiver 20b and/or the base station 60, and/or the signal 1PPS to the PTP master module 30b and/or the RF transceiver 64) that has a phase related to the input signal (e.g., the signal SYNCE RX CLOCK from the PHY transceiver 20a, the signal PTP PHASE from the PTP module 30a and/or the output of the TCXO circuits 70a-70b). One or more of the DPLLs 80a-80n may be configured as a sourcing DPLL. In the example shown, the DPLLs 80a-80b may be the sourcing DPLLs. One of the DPLLs 80a-80n may be a receiving DPLL. In the example shown, the DPLL 80n may be the receiving DPLL. The network board 50 may be configured to select which of the sourcing DPLLs 80a-80b sources the receiving DPLL 80n. The sourcing DPLLs 80a-80b may provide a redundant source for the receiving DPLL 80n and/or may enable synchronous communication over multiple networks. In an example, the device 50 may implement 9 DPLLs (e.g., N=9).

The receiving DPLL 80n may comprise the absorption circuit 100. The absorption circuit 100 may be configured to absorb changes in the total frequency offset of the DPLLs 80a-80n due to a re-arrangement of the sourcing in the DPLLs 80a-80n. For example, the absorption circuit 100 may prevent a phase transient caused by the re-arrangement of the sourcing of the DPLLs 80a-80n. The absorption circuit 100 may enable a hitless re-arrangement of the DPLLs 80a-80n.

A crystal oscillator together with the APLL (e.g., the system clock 82) may provide the clock to all DPLLs 80a-80n. In the example shown, the DPLL 80a (e.g., DPLL0) locks to the temperature compensated oscillators (TCXO) 70a-70b which provides a much better stability over temperature than the crystal oscillator. The sourcing DPLL 80a may output the compensation for the crystal drift compared to the TCXO circuits 70a-70b to the DPLL 80b (DPLL1) and/or the DPLL 80n (DPLL2). The compensation from DPLL0 may provide better unassisted holdover stability to the system. The crystal gives the output clocks of the system a better overall phase noise performance.

In the example shown, the network segment 10a provides a SyncE/PTP network packet stream. In the PHY 20a and the PTP Slave 30a, the physical SyncE clock (e.g., SYNCE RX CLOCK) and the embedded PTP timing (e.g., PTP PHASE) are extracted. DPLL1 locks to the physical SyncE clock SYNCE RX CLOCK and suppresses jitter and/or wander while DPLL2 generates a 1 Pulse Per Second (1PPS) signal from the PTP timing PTP PHASE. DPLL1 provides the frequency offset of the physical SyncE clock SYNCE RX CLOCK to DPLL2 and thereby stabilizes the signal 1PPS generated by DPLL2.

In an example, the DPLL 80a may be locked to the timing signal from one of the temperature compensated oscillator (or oven controlled oscillator) circuits 70a-70b, while the sourcing DPLL 80b may be locked to the SyncE receive clock SYNCE RX CLOCK. The receiving DPLL 80n may be locked to a timing information contained in a packet stream (e.g., PTP PHASE). The DPLL 80a may suppress short term variations on the local crystal oscillator based system clock. The sourcing DPLL 80a may have a high enough bandwidth to track the temperature variations (wander) of the local crystal oscillator based system clock 82 sufficiently. At the same time, the DPLL 80a may have a bandwidth low enough to not let the jitter from one of the TXCO/OCXO circuits 70a-70b pass through. In an example, the sourcing DPLL 80b may be locked to the SyncE timing signal. The receiving DPLL 80n may now be stabilized by one or more of the DPLLs 80a and/or 80b with respect to long and very long term stability, while still having the excellent low output jitter levels due to the local crystal oscillator based system clock 82.

The processor 84 may be configured to process input and/or internal signals of the network board 50. The processor 84 may generate and/or receive signals to/from the various components of the network board 50 (not shown). In some embodiments, the processor 84 may be configured to monitor a status and/or activity of the DPLLs 80a-80n. The processor 84 may implement a monitoring module configured to provide knowledge of a re-arrangement (e.g., when a sourcing DPLL makes a reference switch). For example, using the processor 84 may enable the apparatus 100 to know beforehand that a re-arrangement is upcoming. The processor 84 may provide a-priori information about re-arrangement to inter DPLL coupling and/or reference switches. In some embodiments, the processor 84 may implement an internal processor (e.g., an ARM processor). In some embodiments, the processor 84 may implement a state machine. The implementation of the processor 84 may be varied according to the design criteria of a particular implementation.

Figure 4:
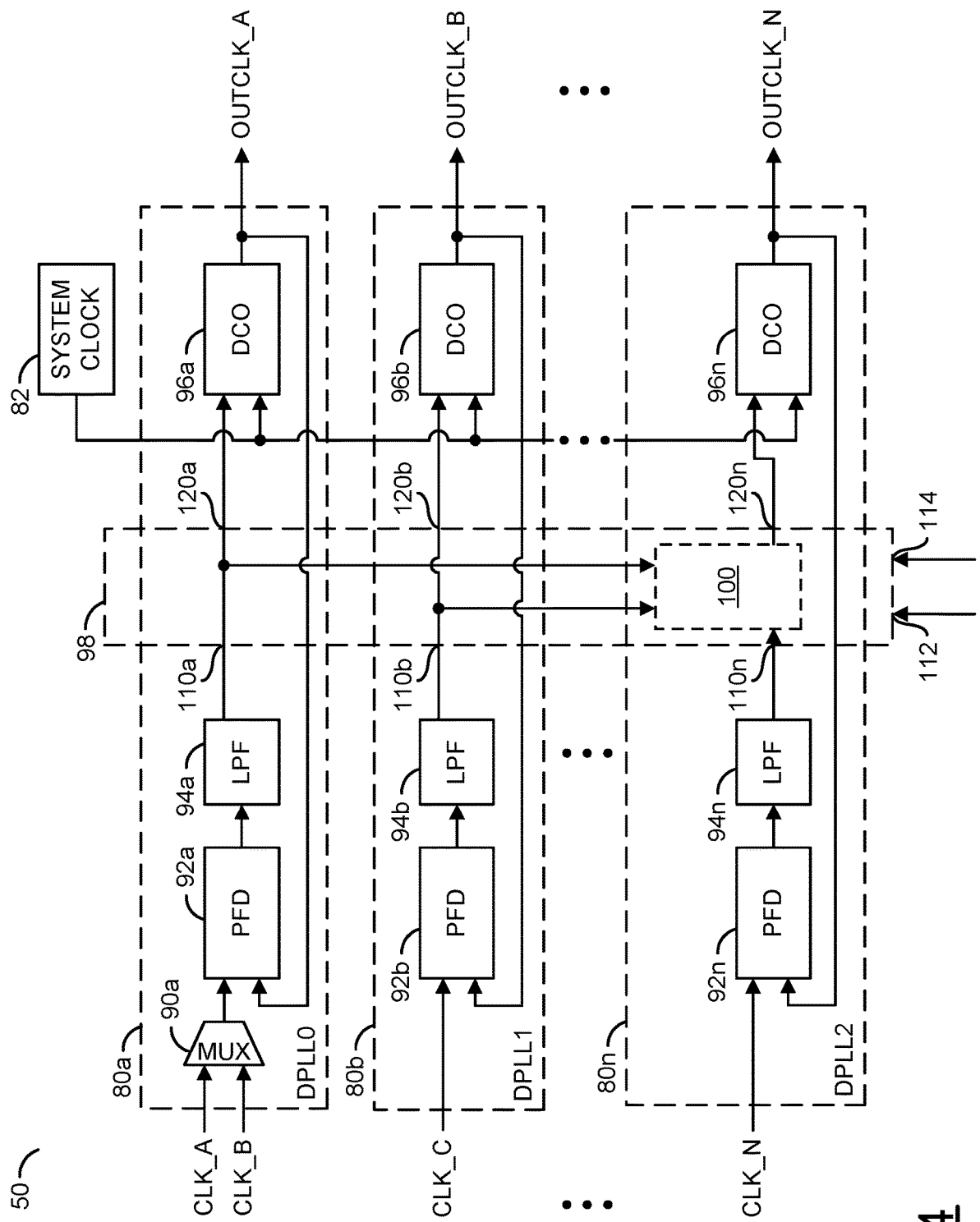
FIG. 4 is a diagram illustrating multiple coupled digital phase-locked loops (DPLLs)

Referring to FIG. 4, a diagram is shown illustrating a conceptual block diagram of the DPLLs 80a-80n of the network card 50 where one of two DPLLs is sourced by a third DPLL. In various embodiments, the system (e.g., the network board 50) may comprise multiple coupled DPLLs 80a-80n.

In the example shown, the DPLL 80a may comprise a block (or circuit) 90a, a block (or circuit) 92a, a block (or circuit) 94a and/or a block (or circuit) 96a. The circuit 90a may implement a multiplexer. The circuit 92a may implement a phase frequency detector (PFD) circuit. The circuit 94a may implement a loop filter (LPF) circuit. The circuit 96a may implement digitally controlled oscillator (DCO) circuit. Similarly, each of the DPLLs 80a-80n may implement similar circuits 90a-90n, 92a-92n, 94a-94n and/or 96a-96n. In some embodiments, one or more of the DPLLs 80a-80n may not implement one or more of the circuits 90a-90n, 92a-92n, 94a-94n and/or 96a-96n. In the example shown, the DPLLs 80b-80n are shown without a respective one of the multiplexers 90a-90n. The DPLLs 80a-80n may implement other components (not shown). The number, type and/or arrangement of the components of the DPLLs 80a-80n may be varied according to the design criteria of a particular implementation.

Each of the DPLLs 80a-80n may receive one or more signals (e.g., CLK_A-CLK_N). The signals CLK_A-CLK_N may be input reference clocks. In one example, the signals CLK_A-CLK_B, presented to the sourcing DPLL 80a, may be an output from the TCXO circuits 70a-70b (e.g., the multiplexer 90a may be configured to select one of the signals CLK_A-CLK_B). In another example, the signal CLK_C, presented to the sourcing DPLL 80b, may be the signal SYNCE RX CLOCK generated by the PHY transceiver 20a. In yet another example, the signal CLK_N, presented to the receiving DPLL 80n, may be the signal PTP PHASE generated by the PTP module 30a.

Each of the DPLLs 80a-80n may generate a signal (e.g., OUTCLK_A-OUTCLK_N). The signals OUTCLK_A-OUTCLK_N may be an output clock signal. The DPLLs 80a-80n may be configured to generate the signals OUTCLK_A-OUTCLK_N to have a phase locked to the input reference clock signals CLK_A-CLK_N received by and/or selected as input by the respective DPLLs 80a-80n. In one example, the signal OUTCLK_B generated by the sourcing DPLL 80b may be the signal SYNCE TX CLOCK received by the PHY transceiver 20b and/or the base station 60. In another example, the signal OUTCLK_C generated by the receiving DPLL 80n may be the signal 1PPS received by the PTP module 30b and/or the base station 60.

The phase frequency detectors 92a-92n may be configured to perform a frequency measurement (e.g., a comparison) of the reference signals CLK_A-CLK_N and a feedback of the output signals OUTCLK_A-OUTCLK_N. The phase frequency detectors 92a-92n may generate an indication of an amount of error (e.g., a difference between the reference signals CLK_A-CLK_N and the feedback of the output signals OUTCLK_A-OUTCLK_N). In one example, the phase frequency detectors 92a-92n may generate a multibit signed phase word (e.g., a phase error signal) in response to a comparison of the respective signals CLK_A-CLK_N and the signals OUTCLK_A-OUTCLK_N. The amount of error detected (e.g., the phase error signal) may be presented to the loop filter circuits 94a-94n.

The loop filters 94a-94n may be configured as a low pass filter. For example, the loop filters 94a-94n may filter high frequencies from the error signals received from the phase frequency detectors 92a-92n. The loop filters 94a-94n may generate a fractional frequency offset (ffo). In some embodiments, the fractional frequency offset may be a digital signal representing a fraction of a frequency. For example, the fractional frequency offset may be used by the DPLLs 80a-80n to pull the output clock signals OUTCLK_A-OUTCLK_N into alignment with the input clock signals CLK_A-CLK_N.

The digitally controlled oscillator circuits 96a-96n may be configured to generate the output clock signals OUTCLK_A-OUTCLK_N. The DCO circuits 96a-96n may align the output clock signals OUTCLK_A-OUTCLK_N to the input clock signals CLK_A-CLK_N in response to the fractional frequency offsets generated by the loop filters 94a-94n. The DCO circuits 96a-96n may each receive an input from the system clock 82. The output clock signals OUTCLK_A-OUTCLK_N generated by the DCO circuits 96a-96n may be provided as feedback to the phase frequency detectors 92a-92n and/or presented as output from the DPLLs 80a-80n.

A block (or circuit) 98 is shown. The block 98 may implement an inter-DPLL coupling. The inter-DPLL coupling 98 may comprise a number of inputs 110a-110n and/or a number of outputs 120a-120n. The inter-DPLL coupling 98 may be configured to receive an input from each of the DPLLs 80a-80n. For example, the inputs 110a-110n and/or the outputs 120a-120n may comprise taps from each of the DPLLs 80a-80n to receive an output (e.g., the fractional frequency offset) from the loop filters 94a-94n. In some embodiments, the absorption circuit 100 may be implemented as a component of the inter-DPLL coupling 98. In some embodiments, the absorption circuit 100 may be a component implemented on the receiving DPLL 80n configured to receive input from the inter-DPLL coupling 98. In some embodiments, the absorption circuit 100 may comprise the inter-DPLL coupling 98 and receive the input from each of the DPLLs 80a-80n. The implementation of the inter-DPLL coupling 98 and/or the absorption circuit 100 may be varied according to the design criteria of a particular implementation. Details of the components of the absorption circuit 100 may be provided in association with FIG. 7.

The absorption circuit 100 and/or the inter-DPLL coupling 98 may comprise a plurality of inputs 110a-110n, an input 112 and/or an input 114. The absorption circuit 100 and/or the inter-DPLL coupling 98 may comprise one or more outputs 120a-120n. In the example shown, the absorption circuit 100 may be implemented as part of the inter-DPLL coupling bus 98 (e.g., the inputs 110a-110m corresponding to the sourcing DPLLs 80a-80m may receive the fractional frequency offset and the absorption circuit 100 may pass through the fractional frequency offset values to the DCO circuits 96a-96n via the corresponding outputs 120a-120m). In some embodiments, the circuit 100 may be implemented as a component of the receiving DPLL 80n (e.g., the absorption circuit 100 may receive the fractional frequency offsets via the inputs 110a-110n but only present one output to the DCO 96n via the output 120n). For example, the inter-DPLL coupling 98 may implement a bus configured to present the fractional frequency offsets from the sourcing DPLLs 80a-80m to the receiving DPLL 80n. The absorption circuit 100 and/or the inter-DPLL coupling 98 may receive two control inputs (e.g., the input 112 and/or the input 114) from the monitoring processor 84. The input 112 and/or the input 114 may be the two signals used to control a state of the absorption circuit 100.

The reference clocks (e.g., CLK_A-CLK_N) to which the DPLLs 80a-80n are locked may each have a different fractional frequency offset (ffo). In one example, initially the receiving DPLL 80n sources the sourcing DPLL 80a through an inter-DPLL coupling bus. In some embodiments, the circuit 100 may implement the inter-DPLL coupling bus 98. Without the absorption circuit 100, if the receiving DPLL 80n switches from sourcing the DPLL 80a to sourcing the DPLL 80b (e.g., a source re-arrangement occurs), the offset that may be added to the output of the loop filter 94n of the receiving DPLL 80n may change instantaneously (e.g., illustrated as a change from 1 phase per minute (ppm) to 5 ppm shown in association with FIG. 5). As a result, the output of the receiving DPLL (e.g., the signal OUTCLK_N) may instantly jump by 4 ppm in response to the re-arrangement.

Since the added offset is within the feedback loop (e.g., from the DCO 96n to the PDF 92n), the receiving DPLL 80n may eventually pull in the offset and after a while the output clock may return to being aligned. The 4 ppm jump may be a rapid change that may introduce a large phase transient on the signal OUTCLK_N. The circuit 100 may be configured to reduce the phase transient caused by the re-arrangement.

Without the circuit 100, the receiving DPLL 80n may add a frequency offset from one or multiple of the sourcing DPLLs 80a-80b to the frequency offset from the loop filter 94n. A re-arrangement may occur if the sourcing DPLL (e.g., 80a) switches to another input reference clock with a different fractional frequency offset (e.g., the multiplexer 90a changes the selection from the signal CLK_A to CLK_B) or the receiving DPLL 80n switches from one sourcing DPLL to another (e.g., from the sourcing DPLL 80a to the sourcing DPLL 80b). The added frequency offset may incur a rapid change that could cause a large phase transient on the output of the receiving DPLL 80n (e.g., OUTPUT CLOCK N). The absorption circuit 100 may be configured to smooth the transition when the re-arrangement occurs.

Another potential source of a phase transient on the output of the receiving DPLL 80n that may be reduced by the absorption circuit 100 may be if the sourcing DPLL (e.g., the DPLL 80a) switches to another reference with a different fractional frequency offset (e.g., the TCXO circuit 70a is disabled and the TCXO circuit 70b provides the reference clock signal to the sourcing DPLL 80a instead). As the sourcing DPLL 80a is locking to the new reference, the frequency offset that is added to the receiving DPLL 80n may be changing as well. Dependent on the bandwidths of the sourcing and receiving DPLLs 80a-80n, the receiving DPLL 80n may likely not be able to compensate for the changing offset fast enough without the absorption circuit 100. As a result, the receiving DPLL 80n may generate a phase transient on the respective output clock OUTCLK_N in response to the re-arrangement.

Figure 5:
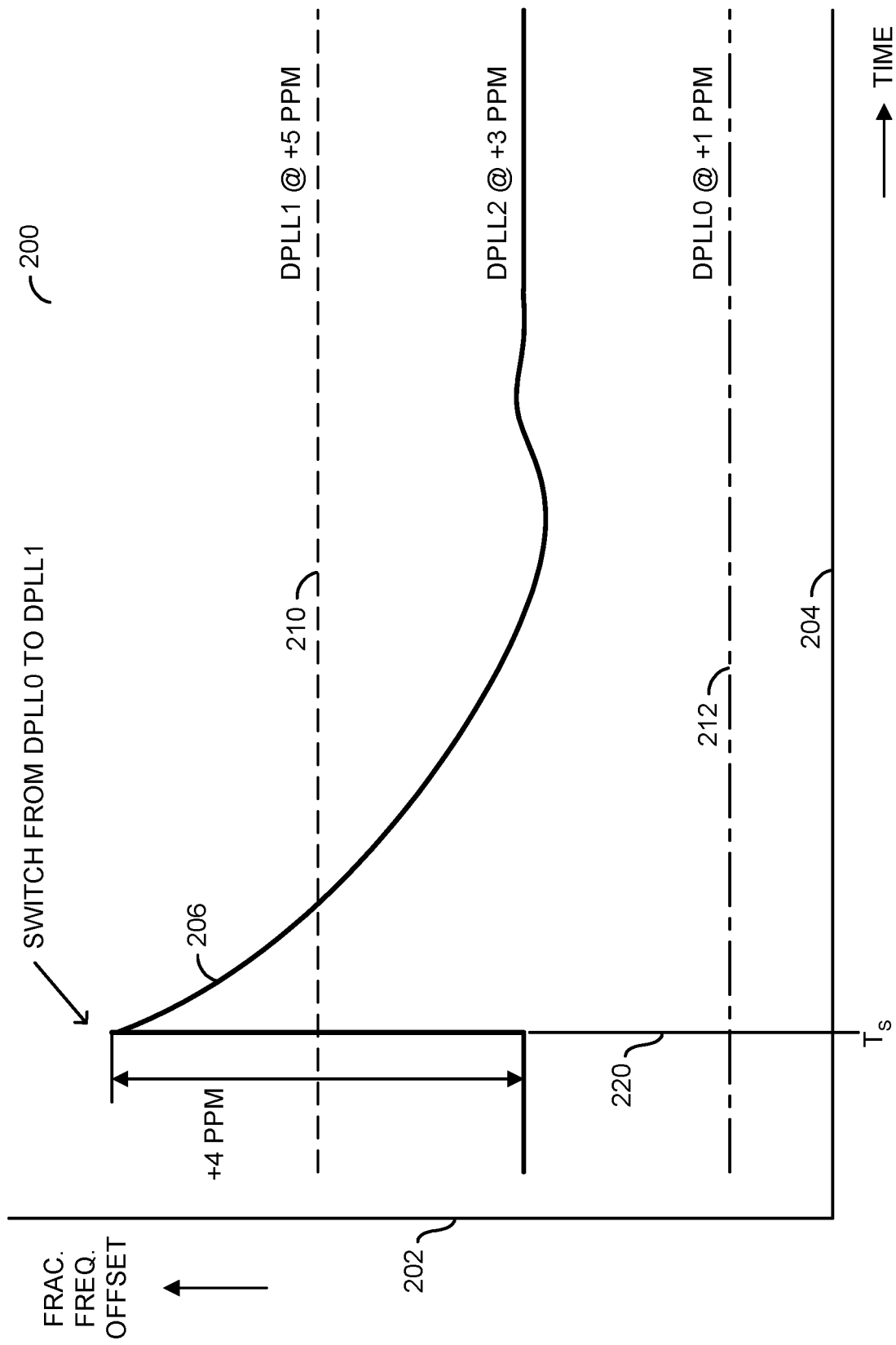
FIG. 5 is a diagram illustrating an example of a fractional frequency offset over time of three DPLLs of FIG. 4 in response to a re-arrangement.

Referring to FIG. 5, a graph 200 illustrating an example of the fractional frequency offset (ffo) over time of the three DPLLs 80a-80n illustrated in FIG. 4 in response to a re-arrangement is shown. The graph 200 may comprise an axis 202 and an axis 204. The axis 202 may be a Y axis representing a fractional frequency offset value. The axis 204 may be an X axis representing a time.

A curve 206 may illustrates the fractional frequency offset (ffo) of the receiving DPLL 80n over time. A line 210 may represent a fractional frequency offset of the sourcing DPLL 80b. In the example shown, the fractional frequency offset of the sourcing DPLL 80b may be approximately +5 ppm. A line 212 may represent a fractional frequency offset of the sourcing DPLL 80a. In the example shown, the fractional frequency offset of the sourcing DPLL 80a may be approximately +1 ppm.

A vertical line 220 is shown. The line 220 may represent a time $T_s$. The time $T_s$ may represent a start of the re-arrangement. At the time $T_s$, the sourcing for the receiving DPLL 80n may switch from the sourcing DPLL 80a to the sourcing DPLL 80b. The curve 206 shows the fractional frequency offset of the receiving DPLL 80n before the time $T_s$ as approximately +3 ppm. At the time $T_s$ (e.g., when the sourcing from the receiving DPLL 80n is switched from the sourcing DPLL 80a to the sourcing DPLL 80b), the curve 206 may have a large spike. The large spike may be a +4 ppm jump. For example, the receiving DPLL 80n may have a +3 ppm fractional frequency offset when being sourced by the DPLL 80a (e.g., the DPLL 80a may have a fractional frequency offset of +1 ppm) before the time $T_s$ and a fractional frequency offset of +7 ppm shortly after the re-arrangement to the sourcing DPLL 80b (e.g., DPLL 80b may have a fractional frequency offset of +5 ppm). In the example shown, the spike of the fractional frequency offset of the receiving DPLL 80n during the re-arrangement may result in a higher fractional frequency offset than the fractional frequency offset of the sourcing DPLL 80b.

After the time $T_s$, the curve 206 is shown settling back to approximately +3 ppm (e.g., the same fractional frequency offset value as before the time $T_s$). The size of the spike during the re-arrangement, the amount of time for the fractional frequency offset of the receiving DPLL 80n to settle and/or the fractional frequency offsets of the DPLLs 80a-80n may be varied according to the design criteria of a particular implementation.

The absorption circuit 100 may be configured to reduce the size of the spike at the time $T_s$ during the re-arrangement of switching from a first of the sourcing DPLLs 80a to a second of the sourcing DPLLs 80b. For example, when using the absorption circuit 100, the curve 206 may remain relatively flat (e.g., having a constant value of approximately +3 ppm).

Figure 6:
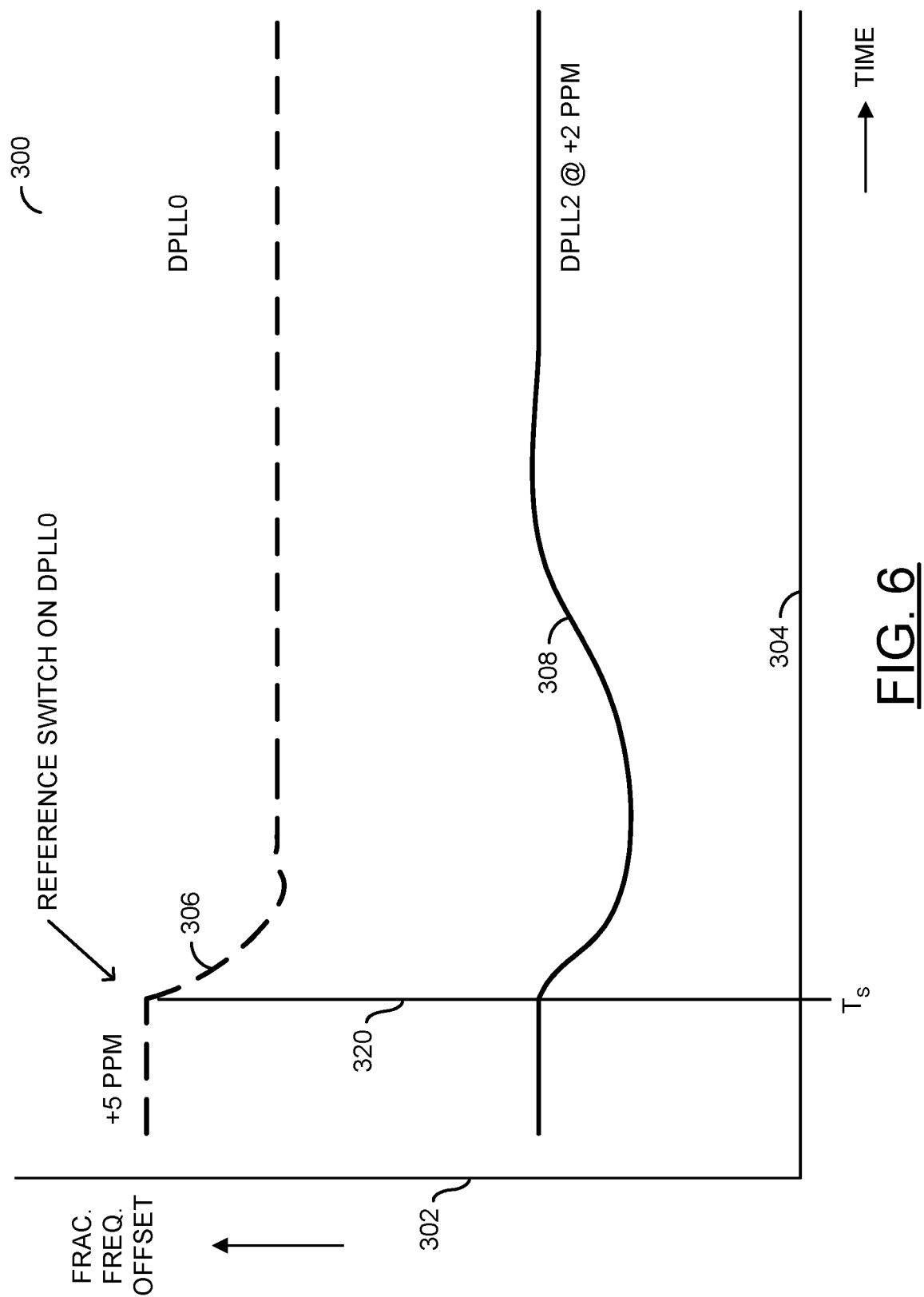
FIG. 6 is a diagram illustrating another example of a fractional frequency offset over time of two DPLLs of FIG. 4 in response to an alternate type of re-arrangement.

Referring FIG. 6, a graph 300 illustrating another example of the fractional frequency offset (ffo) over time of the two DPLLs 80a and 80n in response to the re-arrangement is shown. The graph 300 may comprise an axis 302 and an axis 304. The axis 302 may be a Y axis representing a fractional frequency offset value. The axis 304 may be an X axis representing a time.

A curve 306 may illustrates the fractional frequency offset (ffo) of the sourcing DPLL 80a over time. A curve 308 may represent a fractional frequency offset of the receiving DPLL 80n over time.

A vertical line 320 is shown. The line 320 may represent a time $T_s$. The time $T_s$ may represent a start of the re-arrangement. In the example shown, the sourcing DPLL 80a may provide the sourcing for the receiving DPLL 80n (e.g., before, after and during the time $T_s$). In the example shown, at the time $T_s$ the reference clock of the sourcing DPLL 80a may change from CLK_A to CLK_B (e.g., the re-arrangement may be caused by the multiplexer 90a changing the selection from the output of the TCXO circuit 70a to the output of the TCXO circuit 70b).

Before the time $T_s$ (e.g., when using the reference clock CLK_A), the fractional frequency offset of the sourcing DPLL 80a may be approximately +5 ppm. Before the time $T_s$, the fractional frequency offset of the receiving DPLL 80n may be approximately +2 ppm.

At the time $T_s$, the reference clock for the sourcing DPLL 80a may switch from CLK_A to CLK_B. The curve 306 shows the fractional frequency offset dropping by approximately 1 ppm at the time $T_s$. After the time $T_s$ (e.g., when using the reference clock CLK_B), the fractional frequency offset of the sourcing DPLL 80a may be approximately +4 ppm. For example, the DPLL 80a switches from a +5 ppm reference clock to a +4 ppm reference clock. The bandwidth of the DPLL 80n may be smaller than the bandwidth of the DPLL 80a and the DPLL 80a moves by almost 1 ppm before compensating for the 1 ppm frequency offset difference. The −1 ppm change of the fractional frequency offset of the sourcing DPLL 80a may be a re-arrangement to the receiving DPLL 80n.

In response to the re-arrangement of the reference clocks, at the time $T_s$, the curve 308 may dip. For example, after the time $T_s$, the fractional frequency offset of the receiving DPL 80n may drop to approximately +1 ppm. After an amount of time, the curve 308 may settle back to the original value. For example, the fractional frequency offset of the receiving DPLL 80n may return to the +2 ppm value. The amount of the change during the re-arrangement, the amount of time for the fractional frequency offset of the receiving DPLL 80n to settle and/or the fractional frequency offsets of the DPLLs 80a-80n may be varied according to the design criteria of a particular implementation.

In the example shown, the −1 ppm change of the fractional frequency offset of the sourcing DPLL 80a may be a re-arrangement that results in a corresponding −1 ppm change to the fractional frequency offset of the receiving DPLL 80n. The −1 ppm change of the fractional frequency offset of the receiving DPLL 80n during the re-arrangement may result in a phase transient on the output of the receiving DPLL 80n (e.g., the output OUTCLK_N).

The absorption circuit 100 may be configured to reduce the size and/or length of time of the change at the time $T_s$ during the re-arrangement of switching from a first reference clock for the sourcing DPLL 80a to a second reference clock for the sourcing DPLL 80*a*. For example, when using the absorption circuit 100, the curve 308 may remain relatively flat (e.g., having a constant value of approximately +2 ppm).

Figure 7:
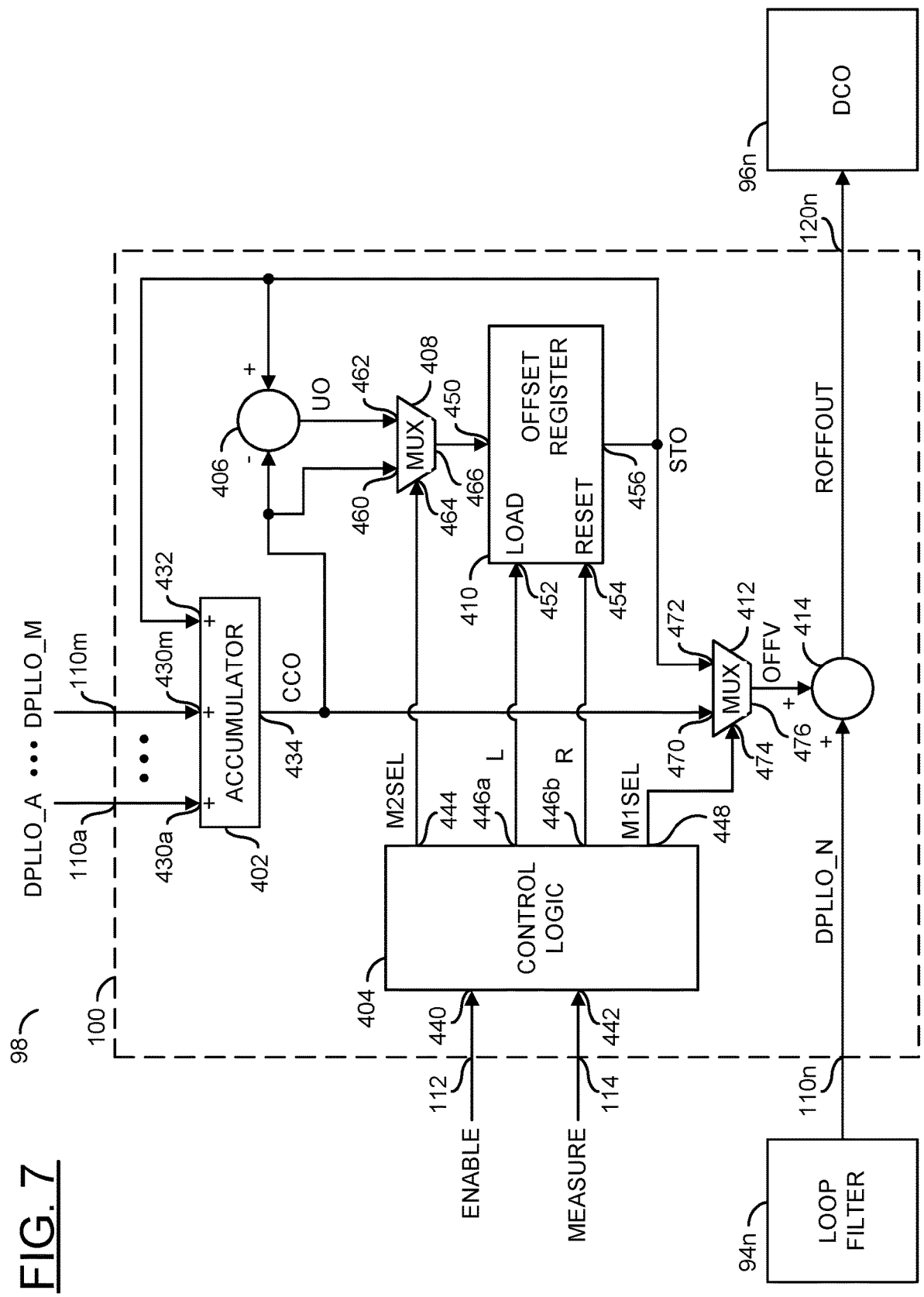
FIG. 7 is a diagram illustrating an example embodiment of the invention.

Referring to FIG. 7, a diagram is shown illustrating an example embodiment of the invention. Details of the components of the absorption circuit 100 are shown. For example, the absorption circuit 100 may receive input from the inter-DPLL coupling 98. The loop filter 94*n* and the digitally controlled oscillator (DCO) 96*n* may be blocks of the receiving DPLL 80*n*. In various embodiments, the absorption circuit 100 may provide a simple mechanism to absorb changes in the total frequency offset of the DPLLs 80*a*-80*n* due to re-arrangements in the combo sourcing and/or reference switches in the sourcing DPLLs 80*a*-80*m*. Because all of the DPLLs 80*a*-80*n* are in the same physical device (e.g., the network board 50), the activity of all the DPLLs 80*a*-80*n* in the system 50 may be monitored easily (e.g., by the internal processor (or state machine) 84). If a re-arrangement to the inter DPLL coupling is made and/or one of the sourcing DPLLs 80*a*-80*m* makes a reference switch, the upcoming re-arrangement may be known beforehand by the processor 84.

In various embodiments, the receiving DPLL 80*n* and/or the inter-DPLL coupling 98 may include the absorption circuit 100. The circuit 100 is generally configured to receive offsets from multiple sourcing DPLLs 80*a*-80*m* and present an offset value to a summing block between the loop filter 94*n* and the DCO 96*n* of the receiving DPLL 80*n*. In some embodiments, the summing block may be implemented by the receiving DPLL 80*n*. In some embodiments, the summing block may be a component of the absorption circuit 100.

In an example embodiment, the absorption circuit 100 may comprise a block (or circuit) 402, a block (or circuit) 404, a block (or circuit) 406, a block (or circuit) 408, a block (or circuit) 410, a block (or circuit) 412 and/or a block (or circuit) 414. The block 402 may be implemented as an accumulator. The block 404 may implement a control logic. The block 406 may be implemented as a summing circuit (or adder). The block 408 may be implemented as a multiplexer circuit. The block 410 may be implemented as a storage element (e.g., register, etc.). For example, the storage element 410 may be an offset register. The block 412 may implement a multiplexer. The block 414 may implement a summing block (e.g., a summing block between the loop filter 94*n* and the DCO circuit 96*n*). The absorption circuit 100 may comprise other components (not shown). The number, type and/or arrangement of the components of the absorption circuit 100 may be varied according to the design criteria of a particular implementation.

In various embodiments, the circuit 100 may receive a number of signals (e.g., DPLLO_A-DPLLO_N) at the inputs 110*a*-110*n*. The signals DPLLO_A-DPLLO_N may be the fractional frequency offset values provided by the DPLLs 80*a*-80*n*. The fractional frequency offset values DPLLO_A-DPLLO_N may be positive values and/or negative values. The circuit 100 may have a first control input 112 that may receive a first signal (e.g., ENABLE) and a second control input 114 that may receive a second signal (e.g., MEASURE). The output 120*n* of the circuit 100 is generally determined by the offsets from the sourcing DPLLs 80*a*-80*m* and/or the control signals ENABLE and MEASURE.

The accumulator 402 may comprise a number of inputs 430*a*-430*m*, an input 432 and an output 434. The inputs 430*a*-430*m* may be configured to receive the fractional frequency offset values DPLLO_A-DPLLO_M from each of the sourcing DPLLs 80*a*-80*m*. The input 432 may receive a signal (e.g., STO). The signal STO may be a value stored by the offset register 410. The output 432 may present a signal (e.g., CCO). The signal CCO may be a current combined offset. The current combined offset CCO may be presented to the multiplexer 412, the summing block 406 and/or the multiplexer 408.

The accumulator 402 may be configured to add (e.g., combine, aggregate, sum, etc.) the offsets DPLLO_A-DPLLO_M from all sourcing DPLLs 80*a*-80*m* together. In one example, the accumulator 402 may be implemented as a sequential accumulator. In another example, the accumulator 402 may be implemented as a combinational accumulator. In addition to adding the offsets DPLLO_A-DPLLO_M, the accumulator 402 may also add the signal STO. In some modes of operation of the absorption circuit 100, the signal STO may have a zero value (e.g., when the offset register 410 is reset). By adding the fractional frequency offsets DPLLO_A-DPLLO_M and the signal STO, the accumulator 402 may generate the current combined offset value CCO.

The control logic circuit 404 may comprise an input 440, an input 442, an output 444, outputs 446*a*-446*b* and/or an output 448. The input 440 may receive the control signal ENABLE. The input 442 may receive the control signal MEASURE. The output 444 may present a signal (e.g., M2SEL) to a control input of the multiplexer 408. The output 446*a* may present a signal (e.g., L) to a control input of the offset register 410. The output 448*a* may present a signal (e.g., R) to a control input of the offset register 410. The output 448 may present a signal (e.g., M1SEL) to a control input of the multiplexer 412. The control logic circuit 404 may be configured to control a state (or mode of operation) of the absorption circuit 100.

The summer block 406 may receive the current combined offset value CCO from the accumulator 402 and/or the signal STO from the offset register 410. The summer block 406 may be configured to generate a signal (e.g., UO). The signal UO may represent an updated offset value. The updated offset value UO may be generated by the summer block 406 by subtracting the current combined offset value CCO from the stored value STO. The updated offset value UO may be a positive value and/or a negative value. The updated offset value UO may be presented to an input of the multiplexer 408.

The offset register 410 may comprise an input 450, a control input 452, a control input 454 and/or an output 456. The offset register 410 may be configured to store one or more values. The offset register 410 may store a value presented to the input 450 by the multiplexer 408. The control input 452 may be a load control for the offset register 410. The input 452 may receive the signal L from the control logic circuit 404. The control input 454 may be a reset control for the offset register 410. The input 454 may receive the signal R from the control logic circuit 404. The offset register 410 may present the stored value as the signal STO. The stored value STO may be presented by the output 456 of the offset register 410 to the multiplexer 412, the summer block 406 and/or the accumulator 402.

The multiplexer 408 may comprise an input 460, an input 462, a control input 464 and/or an output 466. The input 460 may receive the current combined offset value CCO from the accumulator 402. The input 462 may receive the updated offset value UO calculated by the summer block 406. The control input 464 may receive the signal M2SEL from the control logic circuit 404. The signal M2SEL may be used by the multiplexer 408 to select between the signal CCO on the input 460 and the signal UO on the input 462. The signal CCO or the signal UO may be presented by the output 466 based on the selection signal M2SEL. The selected signal may be presented to the offset register 410. For example, the offset register 410 may store the current combined offset value CCO when the input 460 is selected in one mode of operation and the updated offset value UO when the input 462 is selected in another mode of operation.

The multiplexer 412 may comprise an input 470, an input 472, a control input 474 and/or an output 476. The input 470 may receive the current combined offset value CCO from the accumulator 402. The input 472 may receive the stored value STO stored by the offset register 410. The control input 474 may receive the signal M1SEL from the control logic circuit 404. The signal M1SEL may be used by the multiplexer 412 to select between the signal CCO on the input 470 and the signal STO on the input 472. The signal CCO or the signal STO may be presented by the output 476 based on the selection signal M1SEL. For example, the multiplexer 412 may be configured to enable and/or disable presenting an output from the absorption feature (e.g., by selecting between the output from the accumulator 402 and the output from the offset register 410). The selected signal may be presented to the summer block 414. The selected signal may be presented as a signal (e.g., OFFV). The signal OFFV may be a selected offset value.

The summer block 414 may receive the signal OFFV from the multiplexer 412 and the fractional frequency offset value DPLLO_N received at the input 110*n* from the loop filter 94*n* of the receiving DPLL 80*n*. The summer block 414 may be configured to combine (e.g., add and/or aggregate) the fractional frequency offset value DPLLO_N and the selected offset value OFFV. The combined value of the fractional frequency offset value DPLLO_N and the selected offset value OFFV may be a signal (e.g., ROFFOUT). The signal ROFFOUT may be presented by the output 120*n* of the absorption circuit 100. The signal ROFFOUT may be an output offset value of the absorption circuit 100 used by the receiving DPLL 80*n*. The signal ROFFOUT may be presented to the DCO circuit 96*n*.

The processor 84 may be configured to indicate to the absorption circuit 100 that a re-arrangement is upcoming. For example, the signals ENABLE and/or MEASURE may be asserted and/or de-asserted by the processor 84 based on an upcoming re-arrangement and/or a locking status of the DPLLs 80*a*-80*n*. When a re-arrangement is upcoming, the absorption circuit 100 may be configured to store the current combined offset value CCO (e.g., the current combined offset from all of the sourcing DPLLs 80*a*-80*m*). For example, the accumulator 402 may calculate the current combined frequency offset CCO and the signal CCO may be presented to the offset register 410 for storage. The control logic circuit 404 may read the signals ENABLE and/or MEASURE from the processor 84 to generate the signal M2SEL and/or L such that the offset register 410 is in a load state and the multiplexer 408 selects the CCO value.

Before the re-arrangement, the control logic 404 may generate the signal M1SEL such that the multiplexer 412 selects the current combined offset value CCO. When the re-arrangement is upcoming, the multiplexer 412 may switch from selecting the CCO value from the accumulator 402 to selecting the stored value STO from the offset register 410. For example, the control logic 404 may read the signals ENABLE and/or MEASURE from the processor 84 to generate the signal M1SEL such that the multiplexer 412 selects the STO value.

Once the re-arrangement is done and the sourcing DPLLs 80*a*-80*m* are stable (e.g., locked), the offset register 410 may be updated with the difference between the previously stored offset and the new current combined offset from the accumulator 402 (e.g., the updated offset value UO determined by the summer block 406). For example, during the re-arrangement, the accumulator 402 may continue to calculate the current combined offset value CCO. However, the offset register 410 may not load the CCO value (e.g., the signal L may not activate the load control input for the offset register 410) and the multiplexer 412 may not select the CCO value. After the re-arrangement is done, the signal M2SEL may be generated to select the updated offset value UO at the input 462 of the multiplexer 408 and the updated offset value UO may be stored by the offset register 410. The new updated offset value UO may be presented to the input 432 of the accumulator 402 to add to the current combined offset value CCO determined from all of the sourcing DPLLs 80*a*-80*m*.

Generally, the absorption circuit 100 is controlled with two signals (e.g., the control input ENABLE and the control input MEASURE). The control input signal ENABLE may activate the use of the offset register 410 to absorb transients of the overall combined offset from all the sourcing DPLLs 80*a*-80*m*. For example, the signal ENABLE may be used to generate the signal L to enable a load of the offset register 410. When the signal ENABLE is disabled, the offset register 410 may be reset to a zero value. The control input signal MEASURE may be generally asserted just before the re-arrangement takes place and de-asserted shortly after the re-arrangements are done and all of the sourcing DPLLs 80*a*-80*m* have locked/settled.

In various embodiments, the apparatus 100 may provide a mechanism to absorb changes in the total frequency offset of the DPLLs 80*a*-80*m* due to the re-arrangements in the combo sourcing and/or reference switches (e.g., input changes) in the sourcing DPLLs 80*a*-80*m*. The coupling of one DPLL to one or multiple DPLLs may affect the frequency tracking of the DPLLs 80*a*-80*n*. When there is a coupling between multiple DPLLs, one DPLL output may respond to frequency changes on the input of one or more other DPLLs. When there is a re-arrangement in the sourcing of the DPLLs and/or if a sourcing DPLL makes a reference switch to a new reference clock with a different fractional frequency offset, implementation of the apparatus 100 may result in no detectable transient on the output of the receiving DPLL 80*n* (e.g., OUTCLK_N).

The offset register 410 may store the current combined offset value CCO to be used as an intermediate value during the re-arrangement. By using the stored value STO as the intermediate value there may not be as dramatic a change in the total frequency offset. Using the stored value STO may smooth the transition of the fractional frequency offset total until the sourcing DPLLs 80*a*-80*m* have settled.

The absorption circuit 100 may be configured to absorb changes in the frequency offset and/or reduce a phase transient on the output of the receiving DPLL 80*n* by presenting a selected offset value (e.g., the signal OFFV) based on the current combined offset value CCO generated by the accumulator 402 and adding the signal OFFV to the offset value DPLLO_N presented by the loop filter 94*n* of the receiving DPLL 80*n* during normal operation (e.g., when the sourcing DPLLs 80*a*-80*m* are locked and/or no re-arrangement is upcoming). The absorption circuit 100 may be configured to absorb changes in the frequency offset and/or reduce a phase transient on the output of the receiving DPLL 80*n* by storing the current combined offset value CCO in the offset register 410 when the re-arrangement is upcoming. During the re-arrangement, the stored value STO from the offset register 410 may be selected as the selected value OFFV and added to the offset value DPLLO_N. After the re-arrangement (e.g., when all the sourcing DPLLs 80a-80m are stable), the updated offset value UO (e.g., the difference between the current combined offset value CCO and the stored value STO) may be stored in the offset register 410. The offset register 410 may present the updated offset value UO as the stored value STO. The absorption circuit 100 may be configured to absorb changes in the frequency offset and/or reduce a phase transient on the output of the receiving DPLL 80n by adding the updated value UO (e.g., via the signal STO presented to the input 432) to the fractional frequency offset values DPLLO_A-DPLLO_N using the accumulator 402 and presenting the current combined offset value CCO generated by the accumulator 402 as the selected offset value OFFV after the re-arrangement has finished.

Figure 8:
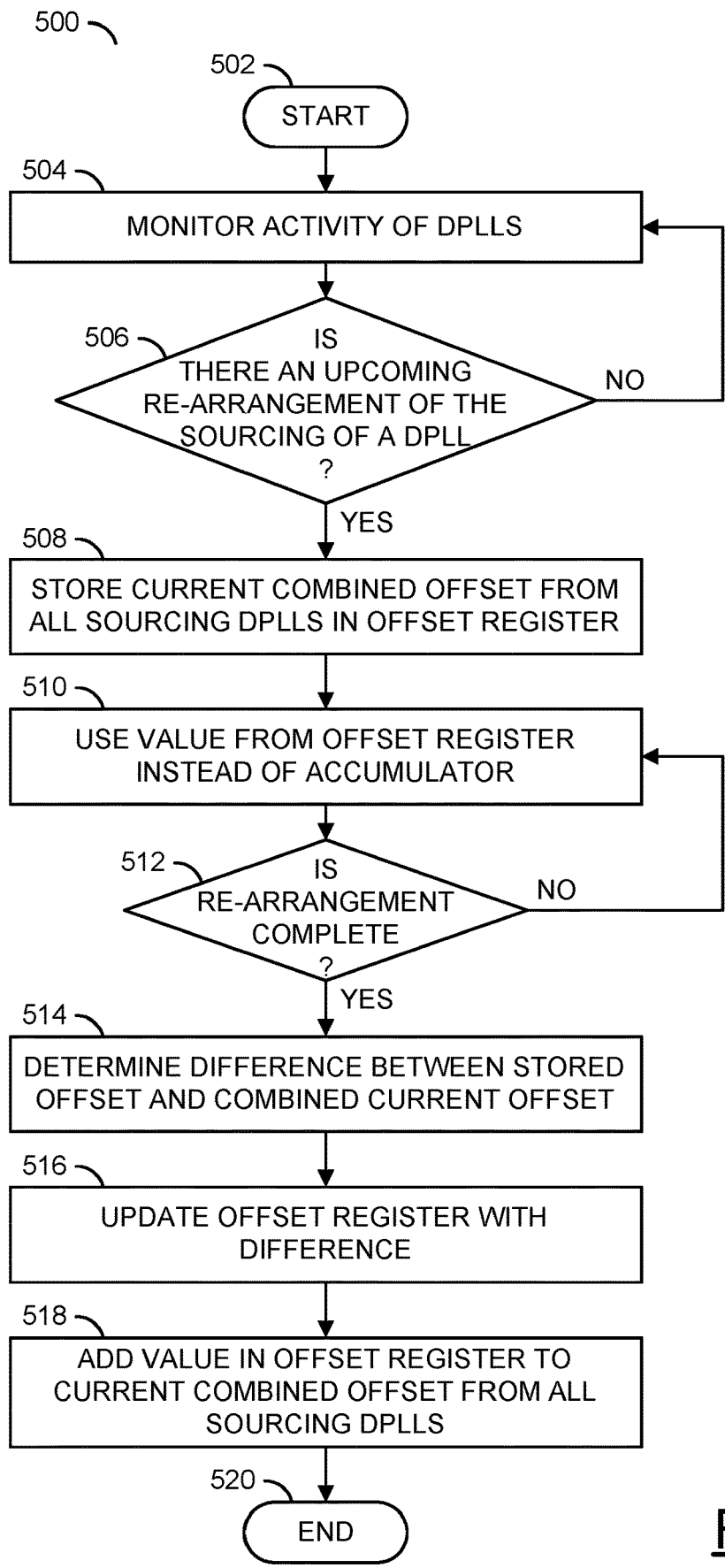
FIG. 8 is a flow diagram illustrating a method for reducing a phase transient caused by a re-arrangement.

Referring to FIG. 8, a method (or process) 500 is shown. The method 500 may reduce a phase transient caused by a re-arrangement. The method 500 generally comprises a step (or state) 502, a step (or state) 504, a decision step (or state) 506, a step (or state) 508, a step (or state) 510, a decision step (or state) 512, a step (or state) 514, a step (or state) 516, a step (or state) 518, and a step (or state) 520.

The state 502 may start the method 500. In the state 504, the processor 84 may monitor the activity of the DPLLs 80a-80n. Next, the method 500 may move to the decision state 506. In the decision state 506, the processor 84 may determine whether there is an upcoming re-arrangement of the sourcing of the receiving DPLL 80n. For example, the processor 84 may determine whether the sourcing for the receiving DPLL 80n may be changed from one sourcing DPLL (e.g., 80a) to another sourcing DPLL (e.g., 80b). In another example, the processor 84 may determine whether the reference clock for the sourcing DPLL (e.g., 80a) may be changed from one reference clock (e.g., CLK_A) to another reference clock (e.g., CLK_B). If there is not an upcoming re-arrangement, the method 500 may return to the state 504. If there is an upcoming re-arrangement, the method 500 may move to the state 508.

In the state 508, the offset register 410 may store the current combined offset value CCO generated by the accumulator 402 in response to a combination of all of the fractional frequency offsets DPLLO_A-DPLLO_N from the sourcing DPLLs 80a-80m (and the updated offset value UO, if any, received at the input 432). Next, in the state 510, the absorption circuit 100 may use the stored value STO from the offset register 410 instead of the current combined offset value CCO generated by the accumulator 402. For example, the multiplexer 412 may change the selected output OFFV from the current combined offset value CCO to the stored value STO. Next, the method 500 may move to the decision state 512.

In the decision state 512, the processor 84 may determine whether the re-arrangement is complete. For example, the DPLLs 80a-80n may be configured to provide feedback to the processor 84 about the locking status. The re-arrangement may be complete when the sourcing DPLLs 80a-80m are locked/stable. If the re-arrangement is not complete, the method 500 may return to the state 510. If the re-arrangement is complete, the method 500 may move to the state 514.

In the state 514, the summer block 406 may determine the difference between the stored offset value STO and the current combined offset value CCO. Next, in the state 516, the offset register 410 may be updated with the difference (e.g., the offset register 410 may store the signal UO received at the input 450). In the state 518, the accumulator 402 may add the stored value STO (e.g., the updated offset value UO) received at the input 432 to the current combined offset values DPLLO_A-DPLLO_M received at the inputs 430a-430m from all of the sourcing DPLLs 80a-80m. Next, the method 500 may move to the state 520. The state 520 may end the method 500.

Figure 9:
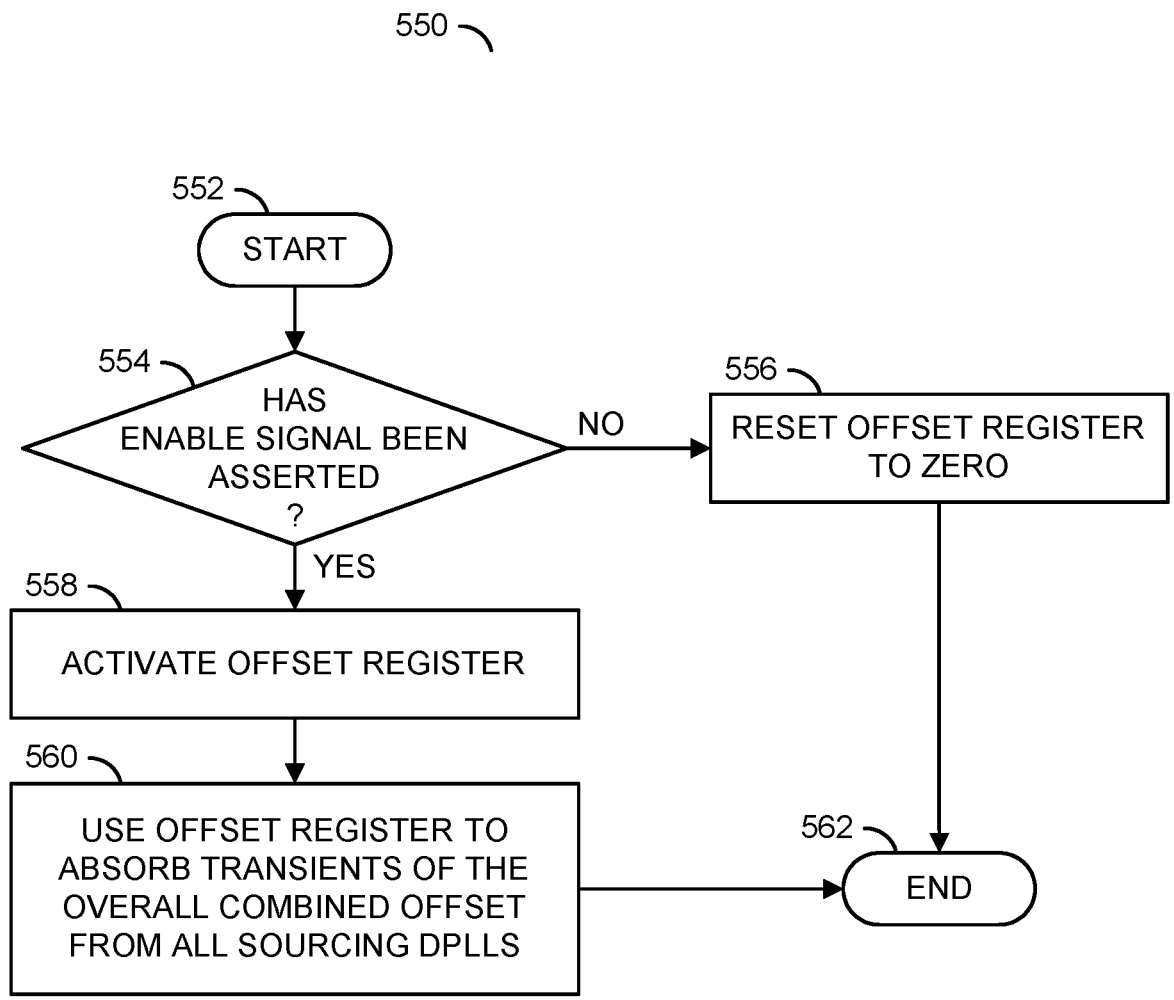
FIG. 9 is a flow diagram illustrating a method for controlling an offset register.

Referring to FIG. 9, a method (or process) 550 is shown. The method 550 may control the offset register 410. The method 550 generally comprises a step (or state) 552, a decision step (or state) 554, a step (or state) 556, a step (or state) 558, a step (or state) 560, and a step (or state) 562.

The state 552 may start the method 550. Next, the method 550 may move to the decision state 554. In the decision state 554, the control logic 404 may determine whether the control signal ENABLE has been asserted. If the control signal ENABLE has not been asserted, the method 550 may move to the state 556. In the state 556, the offset register 410 may be reset to zero. For example, the control logic 404 may generate the output signal R and the signal R may be received by the reset input 454 of the offset register 410. Next, the method 550 may move to the state 562.

In the decision state 554, if the signal ENABLE has been asserted, the method 550 may move to the state 558. In the state 558, the offset register 410 may be activated. Next, in the state 560, the offset register 410 may be used to absorb transients of the overall combined offset from all of the sourcing DPLLs 80a-80m. For example, the control logic circuit 404 may generate the signal L and the signal L may be received at the load input 452 of the offset register 410 to enable the offset register to store the current combined offset value CCO. Next, the method 550 may move to the state 562. The state 562 may end the method 550.

Figure 10:
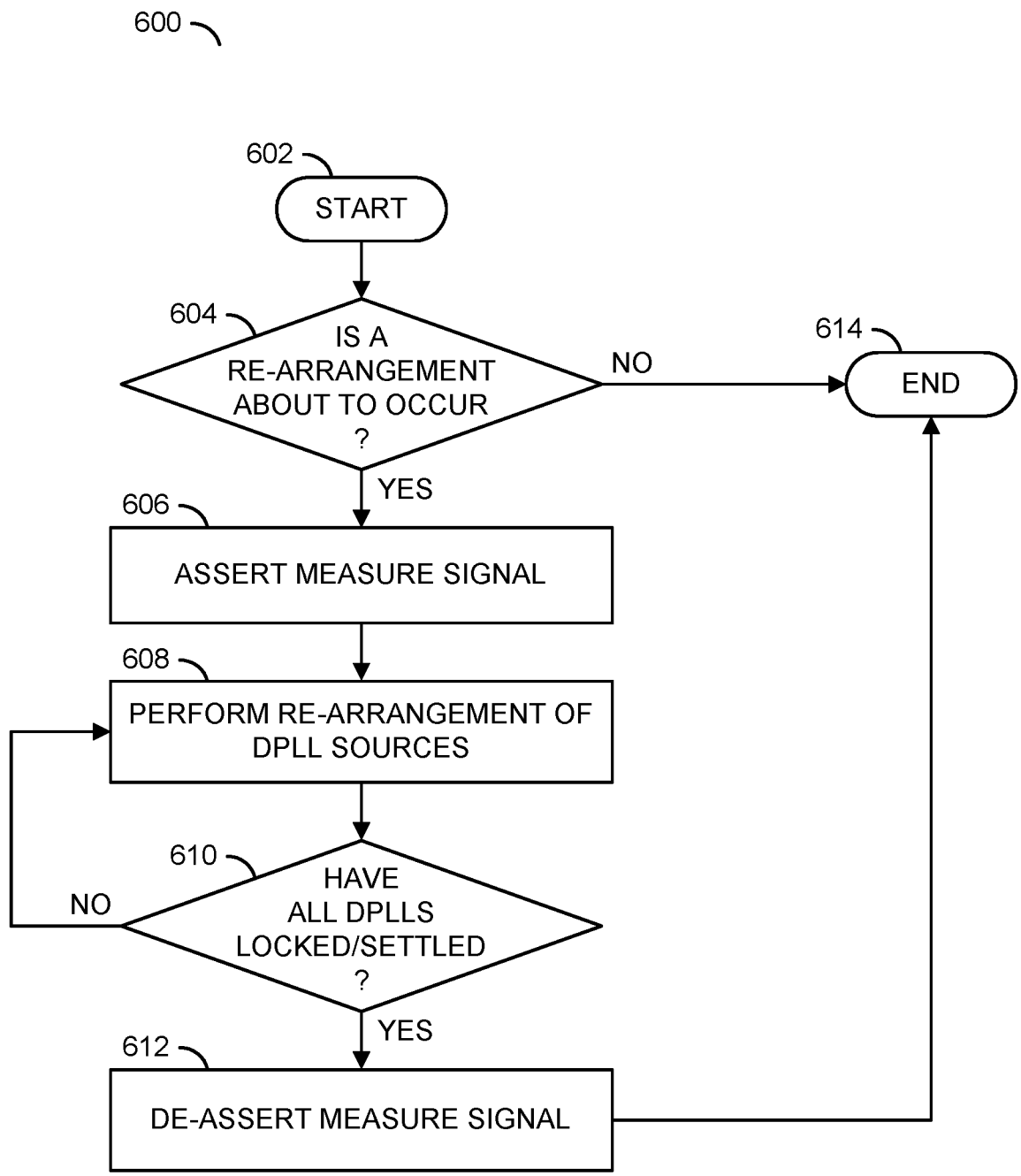
FIG. 10 is a flow diagram illustrating a method for asserting a signal to enable absorbing changes in the total frequency offset due to a re-arrangement.

Referring to FIG. 10, a method (or process) 600 is shown. The method 600 may assert a signal to enable absorbing changes in the total frequency offset due to a re-arrangement. The method 600 generally comprises a step (or state) 602, a decision step (or state) 604, a step (or state) 606, a step (or state) 608, a decision step (or state) 610, a step (or state) 612, and a step (or state) 614.

The state 602 may start the method 600. Next, the method 600 may move to the decision state 604. In the decision state 604, the processor 84 may determine whether a re-arrangement is about to occur. If the re-arrangement is not about to occur, the method 600 may move to the state 614. If the re-arrangement is about to occur, the method 600 may move to the state 606. In the state 606, the processor 84 may assert the signal MEASURE. For example, the input 442 of the control logic circuit 404 may receive the signal MEASURE. Next, in the state 608, the network board 50 may perform the re-arrangement of the sourcing for the receiving DPLL 80n. Next, the method 600 may move to the decision state 610.

In the decision state 610, the processor 84 may determine whether all of the sourcing DPLLs 80a-80m have locked/settled. If the sourcing DPLLs 80a-80m have not locked/settled, the method 600 may return to the state 608. If the sourcing DPLLs 80a-80m have locked/settled, the method 600 may move to the state 612. In the state 612, the processor 84 may de-assert the signal MEASURE. Next, the method 600 may move to the state 614. The state 614 may end the method 600.

Referring to FIG. 11, a method (or process) 650 is shown. The method 650 may adjust control logic in response to a re-arrangement. The method 650 generally comprises a step (or state) 652, a decision step (or state) 654, a step (or state) 656, a step (or state) 658, a step (or state) 660, a step (or state) 662, a decision step (or state) 664, a step (or state) 666, a step (or state) 668, a decision step (or state) 670, a step (or state) 672, a step (or state) 674, a step (or state) 676, and a step (or state) 678.

The state 652 may start the method 650. Next, the method 650 may move to the decision state 654. In the decision state 654, the processor 84 may determine whether to use the absorption feature implemented by the absorption circuit 100. If the absorption feature is not enabled, the method 650 may move to the state 656. In the state 656, the control signal ENABLE and the control signal MEASURE presented to the control logic circuit 404 may have a zero (or logical low) value. Next, in the state 658, the multiplexer 412 may present the current combined offset value CCO from the output 434 of the accumulator 402 to the receiving DPLL 80$n$ and/or clear the stored value in the offset register 410. For example, when the signal ENABLE and the signal MEASURE each are a logical low value, the control logic 404 may generate the signal M1SEL to enable the multiplexer 412 to select the input 470 and generate the signal R to reset the offset register 410. Generally, the signal ENABLE having a value of zero may be a global condition (e.g., at any time/state when the signal ENABLE has the logical low value, the offset register 410 may be cleared and the multiplexer 412 may select the input 470). Next, the method 650 may return to the decision state 654.

In the decision state 654, if the absorption feature is enabled, the method 650 may move to the state 660. In the state 660, the control signal ENABLE may have a one value and the control signal MEASURE may have a zero value. Next, in the state 662, the multiplexer 412 may present the current combined offset value CCO from the output 434 of the accumulator 402 to the receiving DPLL 80$n$. For example, when the signal ENABLE is a logical high value and the signal MEASURE is a logical low value, the control logic 404 may generate the signal M1SEL to enable the multiplexer 412 to select the input 470. Next, the method 650 may move to the decision state 664.

In the decision state 664, the processor 84 may determine whether the re-arrangement is upcoming. If the re-arrangement is not upcoming, the method 650 may return to the decision state 664. If the re-arrangement is upcoming, the method 650 may move to the state 666. In the state 666, the control signal ENABLE and the control signal MEASURE may have a one (or logical high) value. In the state 668, the current combined offset value CCO may be stored from the input 450 of the offset register 410 and/or the multiplexer 412 may present the stored value STO from the output 456 of the offset register 410 to the receiving DPLL 80$n$. For example, when the signal ENABLE and the signal MEASURE each are a logical high value, the control logic 404 may generate the signal M1SEL to enable the multiplexer 412 to select the input 472, generate the signal L to load the offset register 410 and/or generate the signal M2SEL to select the input 460 of the multiplexer 408. Next, the method 650 may move to the decision state 670.

In the decision state 670, the processor 84 may determine whether the sourcing DPLLs 80$a$-80$m$ have locked (or stabilized). If the sourcing DPLLs 80$a$-80$m$ have not locked, the method 670 may return to the state 666. If the sourcing DPLLs 80$a$-80$m$ have locked, the method 650 may move to the state 672. In the state 672, the control signal ENABLE may have a one value and the control signal MEASURE may have a zero value. Next, in the state 674, the updated offset value UO may be presented to the offset register 410. For example, when the signal ENABLE is a logical high value and the signal MEASURE is a logical low value, the control logic 404 may generate the signal M2SEL to enable the multiplexer 412 to select the input 462, generate the signal L to load the offset register 410 with the signal UO and/or generate the signal M1SEL to select the input 470. In the state 676, the multiplexer 412 may select the input 470 to enable the accumulator output 464 (e.g., the signal CCO) to be presented to the receiving DPLL 80$n$ as the signal OFFV and/or combined with the signal DPLLO_N at the summer block 414 to generate the signal ROFFOUT. Next, the method 650 may move to the state 678. The state 678 may end the method 650.

The signal ENABLE and the signal MEASURE may be de-asserted and the control logic 404 may generate the signal M1SEL to select the input 470 and/or generate the signal R to reset the offset register 410. Generally, when the signal ENABLE has is zero, the offset register 410 and/or the signal STO may be reset to zero and/or the multiplexer 412 may select the input 470.

The present invention is not limited to any particular applications, and may be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of data communication can be expected to provide increasing speed, more flexibility, additional commands and different propagation characteristics. The present invention may also be applicable to communication systems implemented in compliance with either existing (legacy) specifications or future specifications.

The functions performed by the diagrams of FIGS. 8-11 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
an accumulator circuit configured to (a) receive a plurality of frequency offset values from a plurality of digital phase-locked loop circuits and (b) generate a combined offset value in response to a sum of said frequency offset values; and
an offset register configured to store a value that corresponds to (a) said combined offset value in a first mode and (b) an updated value in a second mode, wherein (i) said updated value comprises a difference between said value stored in said offset register and a current value of said combined offset value and (ii) said value is presented to a second digital phase-locked loop circuit during a re-arrangement of said plurality of digital phase-locked loop circuits.

2. The apparatus according to claim 1, wherein presenting said value reduces a phase transient caused by said re-arrangement.

3. The apparatus according to claim 1, wherein (i) said value stored in said offset register is presented to said accumulator circuit and (ii) said current value of said combined offset value is generated in response to adding said value stored in said offset register to said sum of said frequency offset values.

4. The apparatus according to claim 1, further comprising a multiplexer configured to present to said second digital phase-locked loop circuit (a) said combined offset value when said re-arrangement is not being performed and (b) said value stored in said offset register during said re-arrangement.

5. A method for reducing a phase transient, comprising the steps of:
(A) receiving a plurality of frequency offset values from a plurality of sourcing digital phase-locked loop circuits;
(B) generating a current combined offset value in response to a sum of said frequency offset values;
(C) storing an offset value in an offset register (i) corresponding to said current combined offset value in a first mode and (ii) corresponding to an updated offset value in a second mode; and
(D) presenting said offset value to a receiving digital phase-locked loop circuit during a re-arrangement of said sourcing digital phase-locked loop circuits, wherein (i) said offset value comprises a difference between said offset value stored in said offset register and said current combined offset value and (ii) presenting said offset value reduces said phase transient caused by said re-arrangement.

6. The method according to claim 5, further comprising the steps of (E) selecting said current combined offset value as an input to said offset register in said first mode and (F) selecting said updated offset value as said input to said offset register in said second mode, wherein the steps (E)-(F) are implemented by a multiplexer.

7. The method according to claim 5, further comprising the step of absorbing changes in a total frequency offset caused by said re-arrangement.

8. The method according to claim 5, wherein said re-arrangement comprises at least one of (i) changing a source for said receiving digital phase-locked loop circuit from a first of said plurality of sourcing digital phase-locked loop circuits to a second of said plurality of sourcing digital phase-locked loop circuits and (ii) changing a reference clock source for one of said plurality of sourcing digital phase-locked loop circuits.

9. The method according to claim 5, further comprising the step of monitoring activity of said sourcing digital phase-locked loop circuits and said receiving digital phase-locked loop circuit, wherein (i) said activity is monitored by implementing a monitoring circuit and (ii) said activity monitored by said monitoring circuit provides prior knowledge of said re-arrangement.

10. The method according to claim 9, wherein said monitoring circuit is configured to implement at least one of (a) an internal processor and (b) a state machine.

11. The method according to claim 5, wherein (i) said receiving said plurality of frequency offset values and said generating said current combined offset value are implemented by an accumulator circuit and (ii) said accumulator circuit is configured to implement at least one of (a) a sequential accumulator and (b) a combinational accumulator.

12. The method according to claim 5, wherein said first mode is enabled when said re-arrangement is upcoming.

13. The method according to claim 5, wherein (i) said second mode is enabled when said re-arrangement is complete and (ii) said re-arrangement is complete when each of said sourcing digital phase-locked loop circuits is stable.

14. The method according to claim 5, further comprising the steps of (E) presenting said updated value to an accumulator circuit, (F) adding said updated value to said sum of said frequency offset values to generate said current combined offset value and (G) presenting said current combined offset value to said receiving digital phase-locked loop circuit.

15. The method according to claim 5, further comprising the steps of (E) receiving an enable signal and a measure signal and (F) implementing control logic for said enable signal and said measure signal.

16. The method according to claim 15, wherein said enable signal is an input configured to activate said first mode to enable said offset register to absorb changes in a total frequency offset from said sourcing digital phase-locked loop circuits.

17. The method according to claim 15, wherein said enable signal is an input configured to reset said offset register to a zero value.

18. The method according to claim 15, wherein (i) said measure signal is an input configured to be asserted before said re-arrangement and de-asserted after said re-arrangement has been completed and (ii) said re-arrangement has been completed when each of said sourcing digital phase-locked loop circuits have locked.

19. The method according to claim 5, further comprising the step of presenting said current combined offset value to said receiving digital phase-locked loop circuit when said re-arrangement is not being performed.

20. The method according to claim 5, further comprising the step of presenting to said receiving digital phase-locked loop circuit one of (a) said current combined offset value and (b) said offset value stored by said offset register, wherein said current combined offset value and said offset value are presented by a multiplexer.

* * * * *